(12) United States Patent
Nagatani et al.

(10) Patent No.: US 7,782,153 B2
(45) Date of Patent: Aug. 24, 2010

(54) TIMING ADJUSTING METHOD AND TIMING ADJUSTING APPARATUS

(75) Inventors: Kazuo Nagatani, Kawasaki (JP); Hiroyoshi Ishikawa, Kawasaki (JP); Nobukazu Fudaba, Kawasaki (JP); Hajime Hamada, Kawasaki (JP); Tokuro Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 560 days.

(21) Appl. No.: 11/429,355

(22) Filed: May 5, 2006

(65) Prior Publication Data

US 2007/0159242 A1 Jul. 12, 2007

(30) Foreign Application Priority Data

Jan. 12, 2006 (JP) ............................. 2006-005110

(51) Int. Cl.
*H03L 1/00* (2006.01)
(52) U.S. Cl. .................... 331/186; 455/126; 455/127.2; 332/145; 332/160
(58) Field of Classification Search ................ 455/126, 455/127.2, 127.3; 331/186; 332/145, 160
See application file for complete search history.

(56) References Cited

U.S. PATENT DOCUMENTS 6,366,177 B1    4/2002  McCune et al.
7,058,425 B1 *  6/2006  Takakusaki ............... 455/561
7,480,344 B2 *  1/2009  Zolfaghari et al. ........ 375/297
2002/0141510 A1 10/2002 Sridharan et al.
2005/0245208 A1 11/2005 Udagawa et al.

FOREIGN PATENT DOCUMENTS

FR    2 837 639    9/2003
JP    3-174810    7/1991

OTHER PUBLICATIONS

European Search Report dated Jul. 6, 2006.

* cited by examiner

*Primary Examiner*—Robert Pascal
*Assistant Examiner*—James E Goodley
(74) *Attorney, Agent, or Firm*—Katten Muchin Rosenman LLP

(57) ABSTRACT

A timing adjusting method detects a phase error between a main signal path from which a transmitting signal is obtained and a control signal path from which a voltage control signal is obtained, based on a to-be-amplified signal that is to be amplified and represents an amplitude or a power of the transmitting signal prior to amplification and a feedback signal that represents an amplitude or a power of the transmitting signal after the amplification, adjusts an amount of delay of at least one of the main signal path and the control signal path so as to mutually cancel the phase error, and amplifies the transmitting signal from the main signal path depending on the voltage control signal from the control signal path. The detecting the phase error may include detecting polarity transition points of a slope of a waveform of the to-be-amplified signal or the feedback signal, and measuring the phase error using the detected polarity transition points.

16 Claims, 19 Drawing Sheets

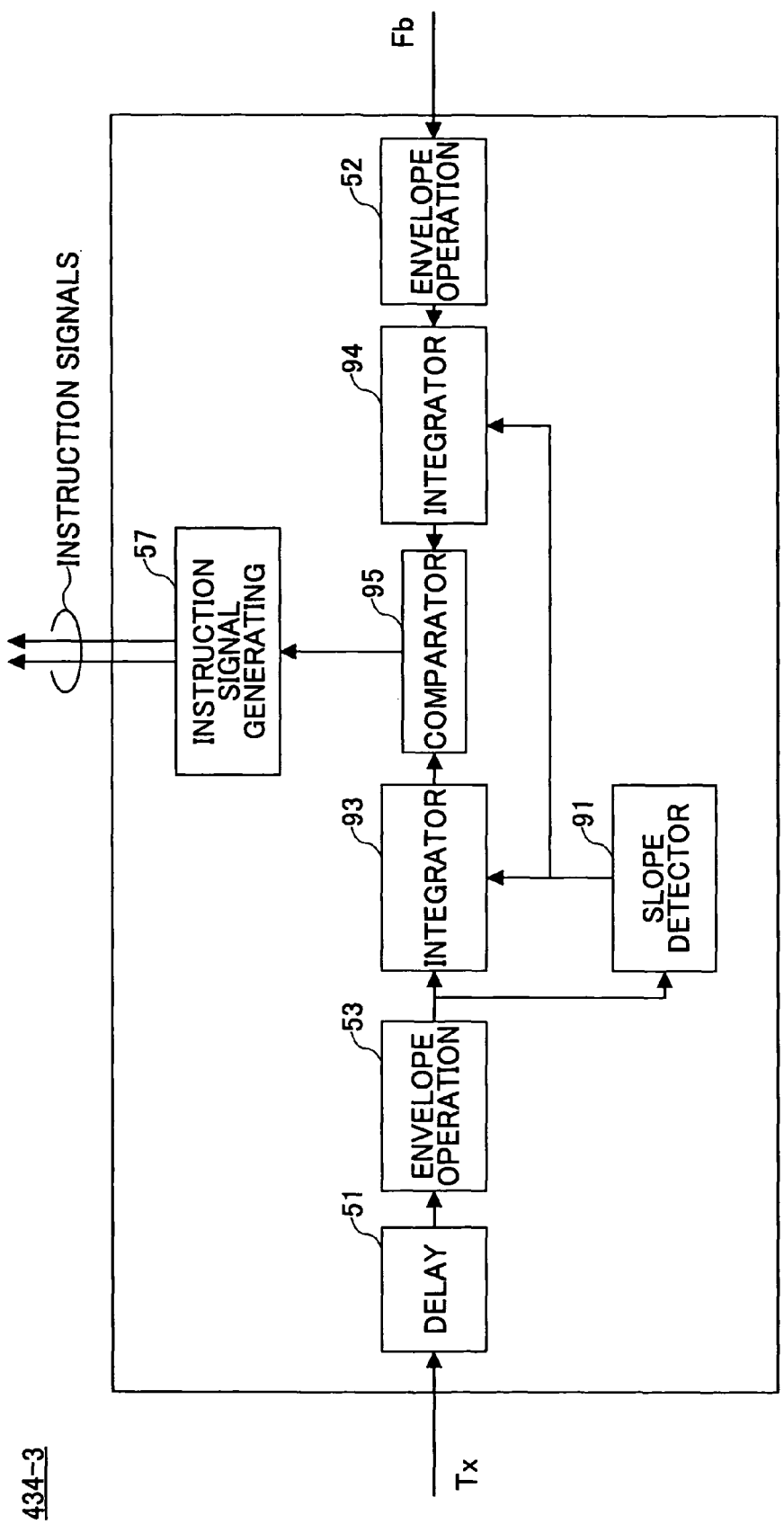

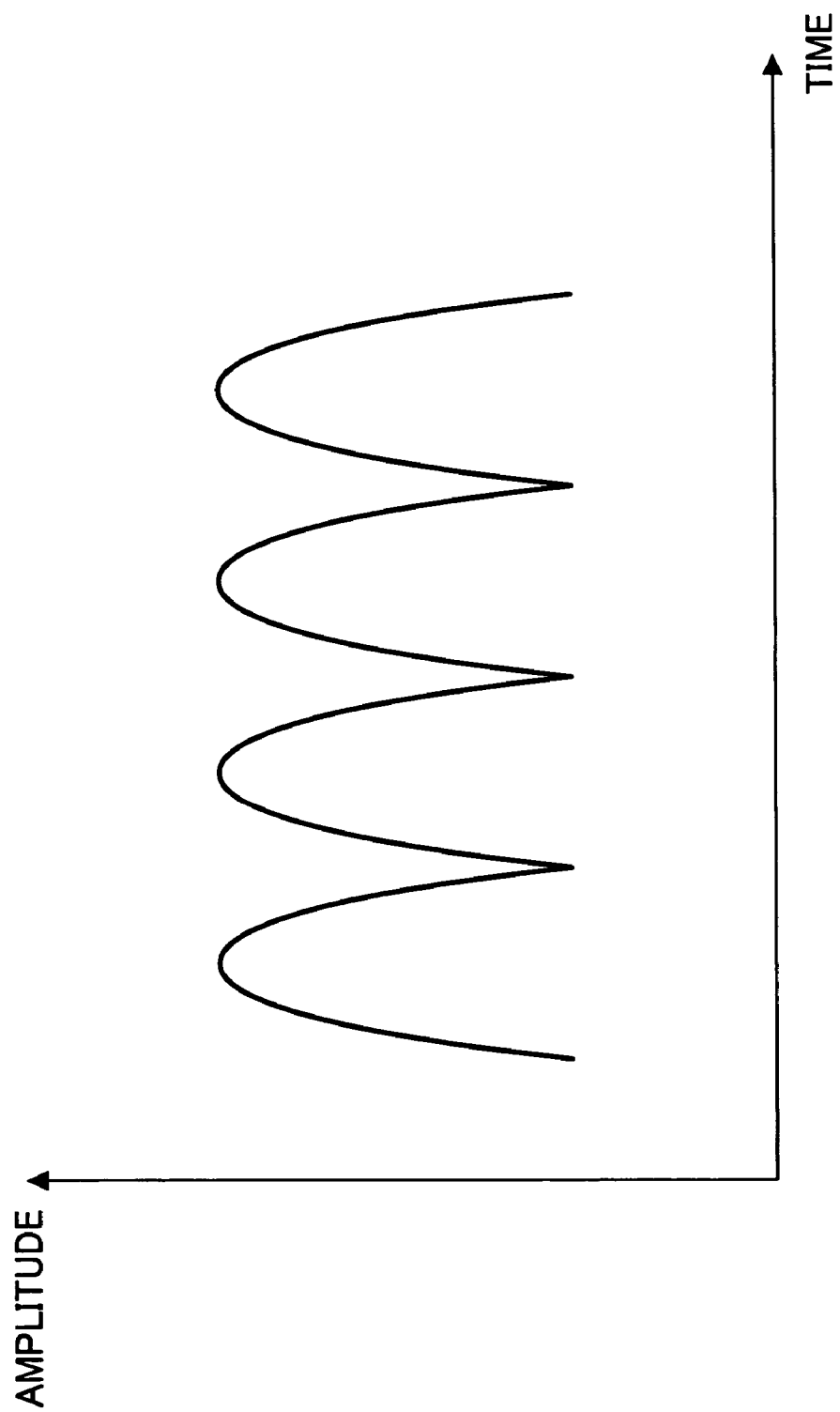

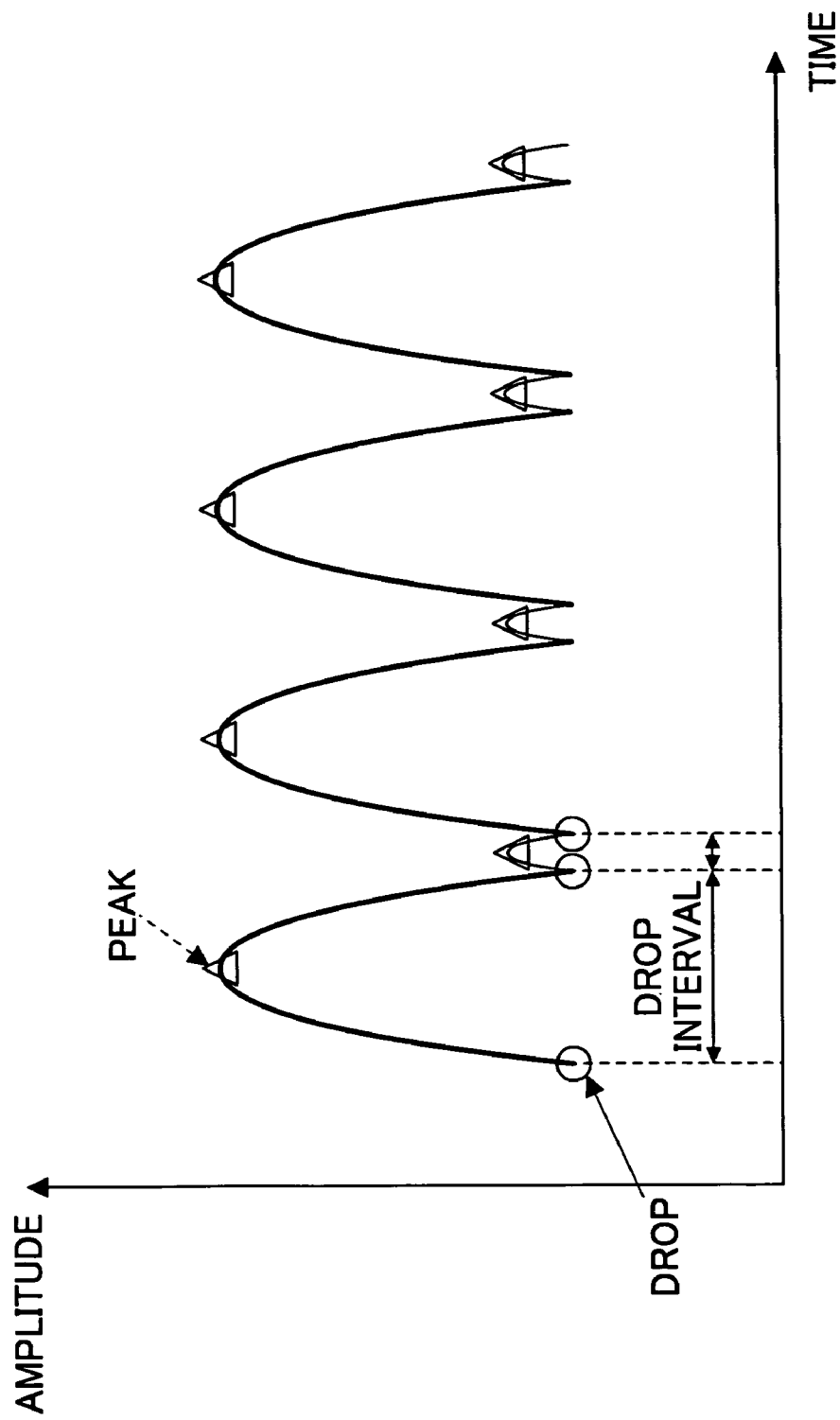

US 7,782,153 B2

TIMING ADJUSTING METHOD AND TIMING ADJUSTING APPARATUS

BACKGROUND OF THE INVENTION

1. Field of the Invention

The present invention generally relates to timing adjusting methods and timing adjusting apparatuses, and more particularly to a timing adjusting method for adjusting timings of an input signal of a power amplifier and a voltage control signal and to a timing adjusting apparatus which employs such a timing adjusting method.

2. Description of the Related Art

In a linear transmission apparatus, signals that are to be transmitted are linearly amplified and transmitted. In order to linearly amplify signals having various levels, power must be supplied to an amplifier to suit the signal having the large level. However, when a large power supply voltage is constantly supplied to the amplifier, there is a problem in that the amplification efficiency greatly deteriorates when amplifying the signal having a small level. This problem is disadvantageous particularly in portable communication apparatuses and compact apparatuses using batteries. For example, a Japanese Laid-Open Patent application No. 3-174810 proposes a technique for copying with this problem by appropriately switching the power supply voltage that is supplied to the amplifier depending on the signal level which is to be amplified.

FIG. 1 is a diagram for explaining an amplifier control of this proposed technique. In FIG. 1, a transmitting signal that is to be transmitted is input to an amplifier 501 as the input signal. The amplifier 501 amplifies the input signal (transmitting signal) depending on a voltage control signal V which changes depending on an amplitude level of the transmitting signal. This voltage control signal V is output from an envelope detector 502 which detects the envelope of the transmitting signal. The voltage control signal V from the envelope detector 502 may be an envelope detection signal or an envelope signal.

FIG. 2 is a diagram showing an input-output characteristic of the amplifier 501. In FIG. 2, the abscissa indicates a power level Pin of the input signal in arbitrary units, and the ordinate indicates a power level Pout of the output signal in arbitrary units. Three input-output characteristics, that is, first, second and third input-output characteristics (1), (2) and (3), are shown in FIG. 2. The first input-output characteristic (1) is linear if the input voltage is a1 or less, but is otherwise non-linear. The second input-output characteristic (2) is linear if the input voltage is a2 or less, but is otherwise non-linear. The third input-output characteristic (3) is linear if the input voltage is a3 or less, but is otherwise non-linear.

The envelope detector 502 shown in FIG. 1 measures the level of the transmitting signal, and sets the voltage control signal V of the amplifier 501 to V1 (V=V1) if the level is small. Hence, the input-output characteristic of the amplifier 501 becomes the first input-output characteristic (1) shown in FIG. 2, and the small signal having the level that is V1 or less is linearly amplified. On the other hand, if the level of the measured transmitting signal is large, the envelope detector 502 sets the voltage control signal V of the amplifier 501 to V3 (V=V3). Thus, the input-output characteristic of the amplifier 501 becomes the third input-output characteristic (3) shown in FIG. 2, and even the large signal having the level that is V3 or less is linearly amplified. Accordingly, by appropriately changing the power supply voltage of the amplifier 501 depending on the input signal, it is possible to obtain the linearly amplified output signal with a high efficiency. Actually, not only the voltages (signal levels) V1, V2 and V3, but a large number of voltages are supplied to the amplifier 501 continuously or in steps.

Because the proposed technique described above appropriately changes the power supply voltage depending on the level of the input signal, the timings of the input signal and the voltage control signal of the amplifier 501 must be appropriately matched. On the other hand, characteristics of elements (particularly characteristics of analog elements) are inconsistent to a certain extent due to characteristics of materials forming the elements, production processes, and production environments. As a result, a slight mismatch may occur between the phase of the transmitting signal (input signal) and the phase of the voltage control signal.

FIG. 3 is a diagram showing the input signal, the output signal and the voltage control signal of the amplifier 501. In FIG. 3, the abscissa indicates the time in arbitrary units, and the ordinate indicates the amplitude levels (or envelope values) in arbitrary units. In addition, the input signal is indicated by a solid line, the output signal is indicated by a fine dotted line, and the voltage control signal is indicated by a coarse dotted line. The phases of the input signal and the voltage control signal should originally match, but in the particular example shown in FIG. 3, a time difference $\tau$ exists between the input signal and the voltage control signal, thereby causing the output signal to have a waveform different from the waveform the output signal should originally have.

During a time T1, the voltage control signal larger than the input signal is supplied to the amplifier 501. In this case, the input signal itself may be linearly amplified, but the amplification efficiency deteriorates since the voltage supplied to the amplifier 501 is larger than the necessary power supply voltage.

During a time T2, the input signal having the level exceeding a maximum voltage that can be linearly amplified by the amplifier 501 is input to the amplifier 501. Hence, the output signal of the amplifier 501 in this case is deviated from the output signal that would be obtained by linearly amplifying the input signal, and the output signal in this case is a non-linearly amplified signal. In addition, since the output signal undergoes a sudden change as indicated by P1 in FIG. 3, unwanted frequency components may be generated thereby.

Therefore, when the timings of the input signal and the voltage control signal are not appropriately matched, signal deterioration, radiation of unwanted waves and the like may occur. The above described problem of the timing mismatch occurs for each individual product, and thus, the timing adjustment must be made for each individual product. But no technique has been proposed to automatically and efficiently adjust the timing mismatch. On the other hand, the adjustment of the timing mismatch is troublesome to perform and time consuming if performed manually, and the manual adjustment is unsuited for the adjustment of the timing mismatch for a large number of products.

SUMMARY OF THE INVENTION

Accordingly, it is a general object of the present invention to provide a novel and useful timing adjusting method and timing adjusting apparatus, in which the problems described above are suppressed.

Another and more specific object of the present invention is to provide a timing adjusting method and a timing adjusting apparatus, which adjusts timings of an input signal and a voltage control signal of an amplifier for a linear transmitter that outputs an output signal having a small distortion with a high amplification efficiency, by switching a power supply voltage of the amplifier depending on the input signal level.

Still another object of the present invention is to provide a timing adjusting apparatus comprising a power amplifying part configured to amplify a transmitting signal from a main signal path depending on a voltage control signal from a control signal path; a timing error detecting part configured to detect a phase error between the main signal path and the control signal path based on a to-be-amplified signal that is to be amplified and represents an amplitude or a power of the transmitting signal prior to amplification and a feedback signal that represents an amplitude or a power of the transmitting signal after the amplification; and an adjusting part configured to adjust an amount of delay of at least one of the main signal path and the control signal path so as to mutually cancel the phase error, wherein the timing error detecting part comprises a detector part configured to detect polarity transition points of a slope of a waveform of the to-be-amplified signal or the feedback signal; and a phase error measuring part configured to measure the phase error using the detected polarity transition points. According to the timing adjusting apparatus of the present invention, it is possible to adjust the timings of the input signal and the voltage control signal of the amplifier for a linear transmitter that outputs an output signal having a small distortion with a high amplification efficiency, by switching a power supply voltage of the amplifier depending on the input signal level.

A further object of the present invention is to provide a timing adjusting method comprising the steps of (a) detecting a phase error between a main signal path from which a transmitting signal is obtained and a control signal path from which a voltage control signal is obtained, based on a to-be-amplified signal that is to be amplified and represents an amplitude or a power of the transmitting signal prior to amplification and a feedback signal that represents an amplitude or a power of the transmitting signal after the amplification; (b) adjusting an amount of delay of at least one of the main signal path and the control signal path so as to mutually cancel the phase error; and (c) amplifying the transmitting signal from the main signal path depending on the voltage control signal from the control signal path, wherein the step (a) comprises detecting polarity transition points of a slope of a waveform of the to-be-amplified signal or the feedback signal; and measuring the phase error using the detected polarity transition points. According to the timing adjusting method of the present invention, it is possible to adjust the timings of the input signal and the voltage control signal of the amplifier for a linear transmitter that outputs an output signal having a small distortion with a high amplification efficiency, by switching a power supply voltage of the amplifier depending on the input signal level.

Another object of the present invention is to provide a computer-readable storage medium which stores a program for causing a computer to carry out a timing adjustment, the program comprising a detecting procedure causing the computer to detect a phase error between a main signal path from which a transmitting signal is obtained and a control signal path from which a voltage control signal is obtained, based on a to-be-amplified signal that is to be amplified and represents an amplitude or a power of the transmitting signal prior to amplification and a feedback signal that represents an amplitude or a power of the transmitting signal after the amplification; an adjusting procedure causing the computer to adjust an amount of delay of at least one of the main signal path and the control signal path so as to mutually cancel the phase error; and an amplifying procedure causing the computer to amplify the transmitting signal from the main signal path depending on the voltage control signal from the control signal path, wherein the detecting procedure comprises causing the computer to detect polarity transition points of a slope of a waveform of the to-be-amplified signal or the feedback signal; and causing the computer to measure the phase error using the detected polarity transition points. According to the computer-readable storage medium of the present invention, it is possible to adjust the timings of the input signal and the voltage control signal of the amplifier for a linear transmitter that outputs an output signal having a small distortion with a high amplification efficiency, by switching a power supply voltage of the amplifier depending on the input signal level.

Other objects and further features of the present invention will be apparent from the following detailed description when read in conjunction with the accompanying drawings.

BRIEF DESCRIPTION OF THE DRAWINGS

FIG. 9 is a functional block diagram showing a timing error detecting part that is used in a third embodiment of the present invention;

FIG. 15A is a diagram showing a two-tone signal; and
FIG. 15B is a diagram showing a feedback signal that is derived from the two-tone signal.

DESCRIPTION OF THE PREFERRED EMBODIMENTS

Figure 1:
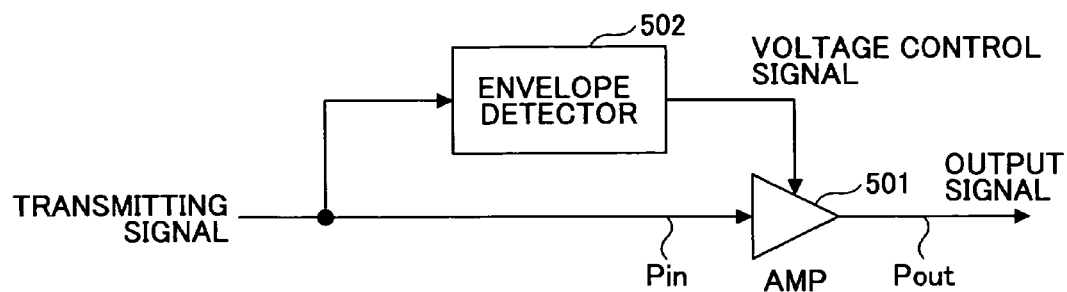
FIG. 1 is a diagram for explaining an amplifier control of a proposed technique.

According to one aspect of the present invention, a phase error between a main signal path and a control signal path based on a to-be-amplified signal that is to be amplified and represents an amplitude or a power of the transmitting signal prior to amplification and a feedback signal that represents an amplitude or a power of the transmitting signal after the amplification, and an amount of delay of at least one of the main signal path and the control signal path is adjusted so as to mutually cancel the phase error. Polarity transition points of a slope of a waveform of the to-be-amplified signal or the feedback signal is detected, and the phase error is measured using the detected polarity transition points.

An interval of the polarity transition points and/or a number of the polarity transition points may be measured so as to judge whether or not the phase error exists. The polarity transition points may correspond to points (drop points) where a decreasing waveform changes to an increasing waveform. The polarity transition points appearing at a frequency exceeding a predetermined frequency may be selected from the polarity transition points and used for the processing at a later stage.

At least one the to-be-amplified signal and the feedback signal may be integrated in the section in which the to-be-amplified signal increases, and at least one of the to-be-amplified signal and the feedback signal may be integrated in the section in which the to-be-amplified signal decreases. The existing of the timing error may be suitably judged depending on whether or not the two integrated values match. The section in which the to-be-amplified signal increases may a section in which the slope of the waveform has a positive polarity, and the section in which the to-be-amplified signal decreases may be a section in which the slope of the waveform has a negative polarity.

A time average of differences between the to-be-amplified signal and the feedback signal may be calculated in the section in which the to-be-amplified signal increases, and the time average of the differences between the to-be-amplified signal and the feedback signal may be calculated in the section in which the to-be-amplified signal decreases. The existence of the timing error may be judged based on a comparison of the two time averages of the differences.

A switching may be made between the waveform of the transmitting signal and a waveform of a predetermined level for every polarity transition point, to output one of the waveforms of the transmitting signal and the predetermined level as the voltage control signal. The feedback signal may be integrated when the switch outputs the waveform of the transmitting signal as the voltage control signal, and the feedback signal may be integrated when the switch outputs the waveform of the predetermined level as the voltage control signal.

A test signal having a known waveform may be used as the transmitting signal. This test signal may be a two-tone signal.

Figure 4:
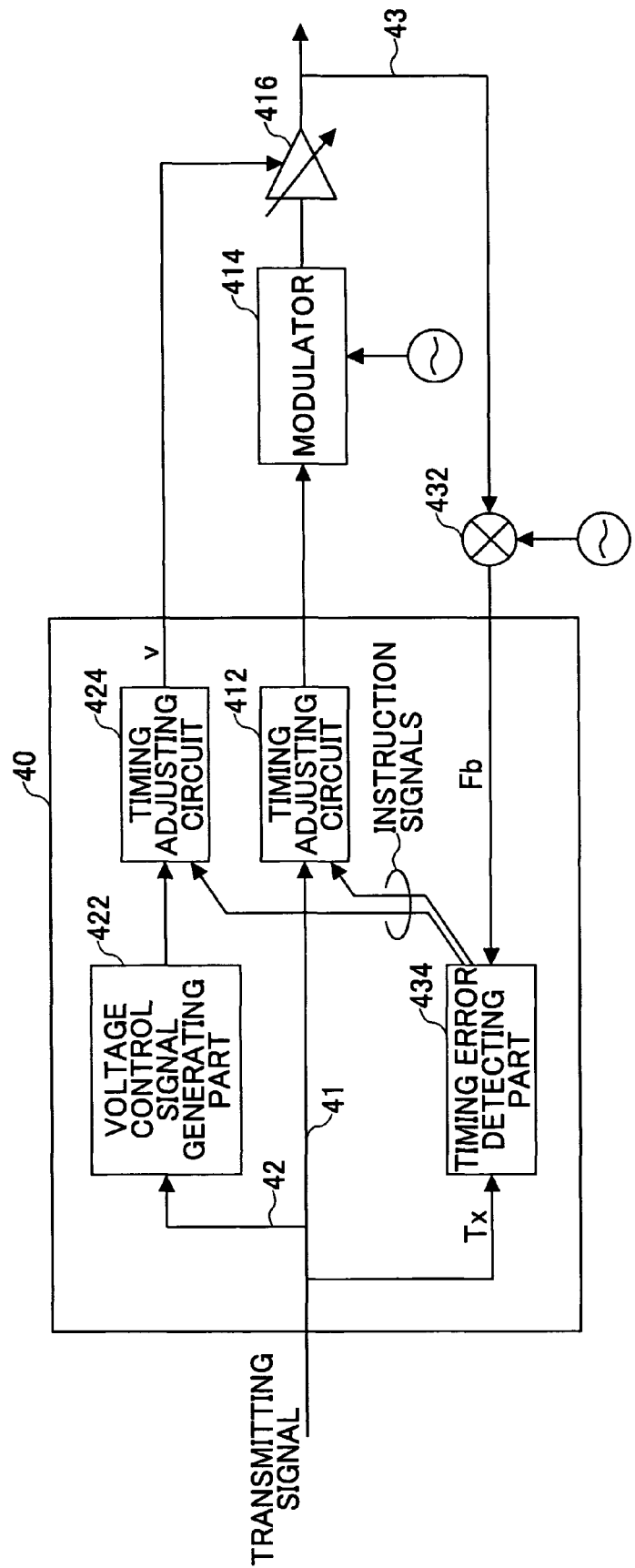
FIG. 4 is a system block diagram showing an important part of a transmitter in a first embodiment of the present invention.

FIG. 4 is a system block diagram showing an important part of a transmitter in a first embodiment of the present invention. FIG. 4 generally shows a main signal path 41 for sending a transmitting signal Tx, a control signal path 42, and a feedback signal path 43 from an amplifier 416. A timing adjusting circuit 412, a modulator 414 and the amplifier 416 are provided in the main signal path 41. A voltage control signal generating part 422 and a timing adjusting circuit 424 are provided in the control signal path 42. A demodulator 432 and a timing error detecting part 434 are provided in the feedback signal path 43.

The amplifier 416 is formed by a power amplifier that amplifies the transmitting signal based on a voltage level indicated by a voltage control signal v input thereto.

Figure 2:
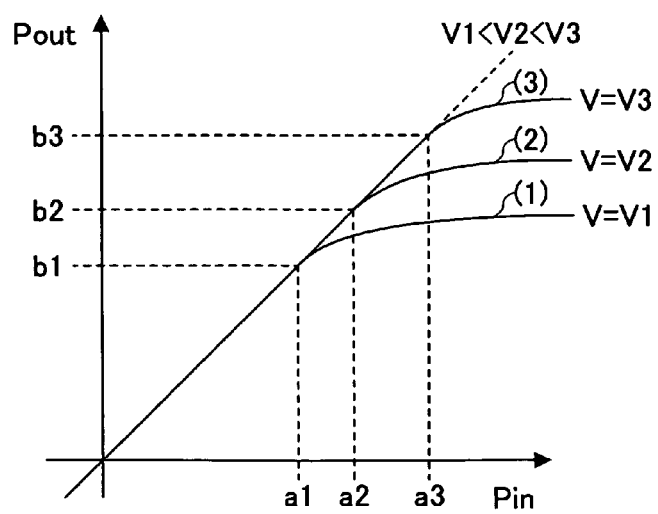
FIG. 2 is a diagram showing an input-output characteristic of an amplifier.
Figure 3:
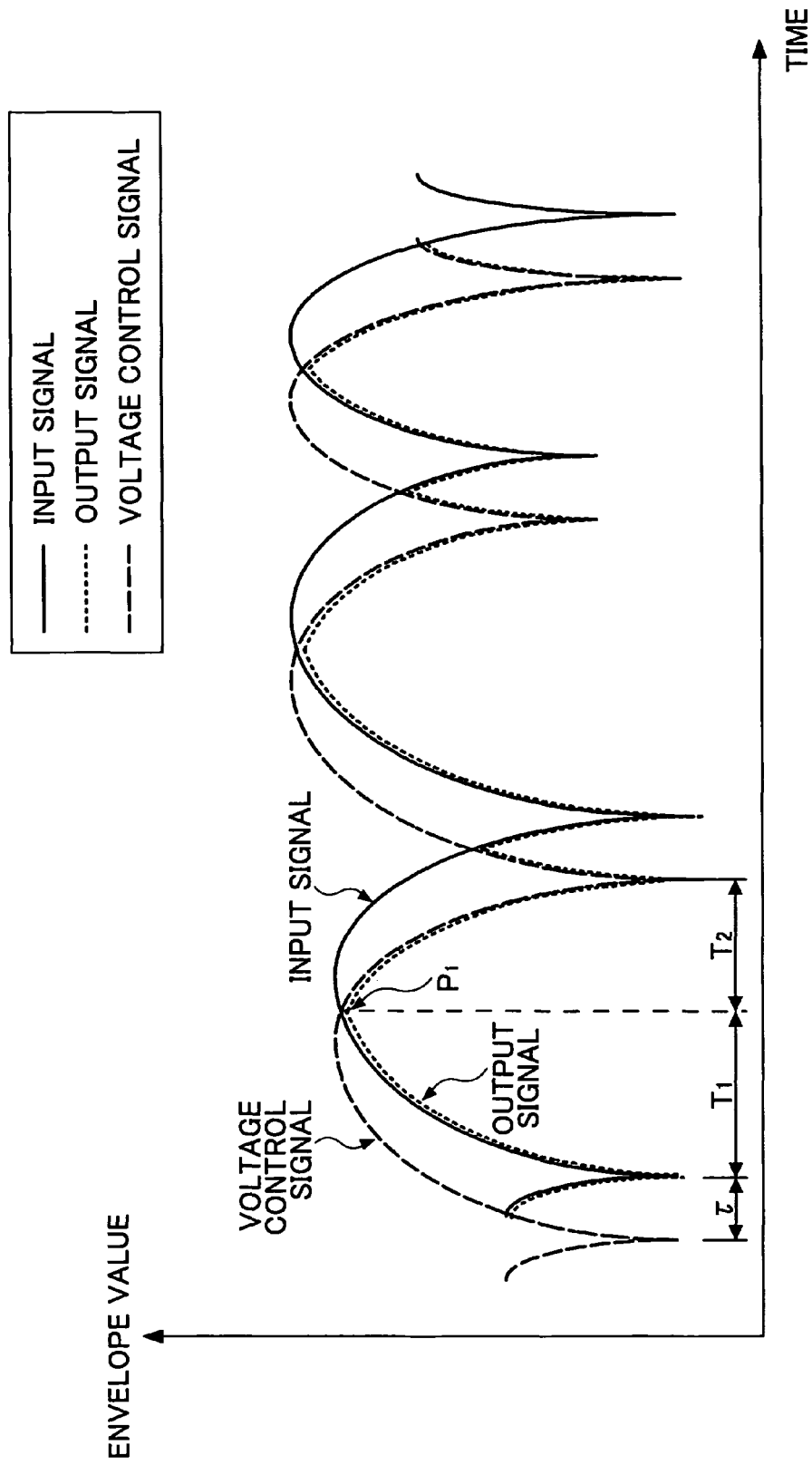
FIG. 3 is a diagram showing an input signal, an output signal and a control signal of an amplifier.

The voltage control signal generating part 422 calculates or measures an amplitude level of the signal input thereto. If the signal input to the voltage control signal generating part 422 is a quadrature modulated signal, the signal magnitude can be calculated by obtained a square root of sum of squares of the same-phase component and the quadrature component. The signal representing the amplitude level is also referred to as an envelope signal. The voltage control signal generating part 422 generates the voltage control signal v that is input to the amplifier 416, depending on the amplitude level of the signal input to the voltage control signal generating part 422. This voltage control signal v generated by the voltage control signal generating part 422 corresponds to the voltage control signal V shown in FIG. 2.

The timing adjusting circuit 424 adjusts the timing of the voltage control signal v by advancing or delaying on the time base the voltage control signal v that is output from the voltage control signal generating part 422 in response to an instruction from the timing error detecting part 434, and inputs the adjusted voltage control signal v to the amplifier 416. In this embodiment, the following timing adjustment is made based on the amplitude level of the transmitting signal Tx. However, the present invention is not limited to the process based on the amplitude level of the transmitting signal Tx, and the timing adjustment may be made based on the power level of the transmitting signal Tx.

The timing adjusting circuit 412 in the main signal path 41 adjusts the timing of the transmitting signal Tx by advancing or delaying the transmitting signal Tx on the time base in response to an instruction from the timing error detecting part 434, and inputs the adjusted transmitting signal Tx to the modulator 414.

The modulator 414 carries out a frequency conversion to transmit the transmitting signal Tx as a radio signal.

The demodulator 432 in the feedback signal path 43 carries out a process, such as a frequency conversion and a filtering, to return the amplified radio transmitting signal back to the baseband signal.

The timing error detecting part 434 obtains a phase error between the main signal path 41 and the feedback signal path 43, based on a feedback signal Fb from the demodulator 432. The timing error detecting part 434 generates instruction signals to be supplied to the timing adjusting circuits 412 and 424. The instruction signals generated by the timing error detecting part 434 include contents for causing the phase errors calculated in the timing adjusting circuits 412 and 424 to be mutually cancelled.

For the sake of convenience, it is assumed that elements within a block 40 carry out digital signal processing. Hence, although not shown in FIG. 4, elements such as a digital-to-analog converter and analog-to-digital converter are actually provided between the block 40 and the amplifier 416. However, the present invention may be realized in either the digital region or in the analog region.

Figure 5:
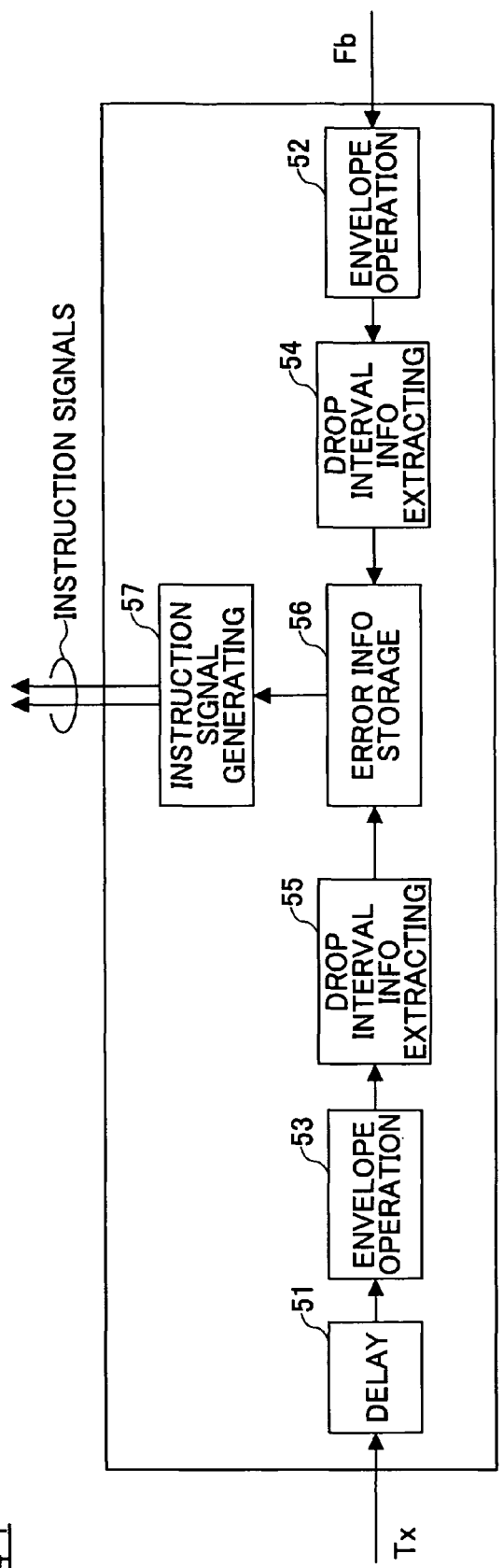
FIG. 5 is a functional block diagram showing a timing error detecting part shown in FIG. 4.

FIG. 5 is a functional block diagram showing a timing error detecting part 434-1 that may be used for the timing error detecting part 434 shown in FIG. 4. The timing error detecting part 434-1 shown in FIG. 5 includes a delay part 51, envelope operation parts 52 and 53, drop interval information extracting parts 54 and 55, an error information storage part 56, and an instruction signal generating part 57.

The delay part 51 delays the transmitting signal Tx by a predetermined delay time. The predetermined delay time is adjusted so as to match the timings of the transmitting signal Tx and the feedback signal Fb.

Each of the envelope operation parts 52 and 53 calculates or measures the amplitude level of the signal-input thereto. If the quadrature modulated signal is input, each of the envelope operation parts 52 and 53 calculates the signal magnitude by obtaining a square root of sum of squares of the same-phase component and the quadrature component. The signal representing the amplitude level is also referred to as an envelope signal.

The drop interval information extracting parts 54 and 55 extract the peak points and/or the drop points of the waveform representing the transmitting signal Tx and the waveform representing the feedback signal, based on the amplitude information acquired from the respective envelope operation parts 52 and 53. In addition, each of the drop interval information extracting parts 54 and 55 calculates the interval between the extracted drop points (that is, the interval between adjacent drop points). Of the points where the polarity of the slope (or gradient) of the signal waveform changes, the point where the polarity changes from a negative polarity to a positive polarity with lapse of time will be referred to as the "drop point" in this specification. Furthermore, of the points where the polarity of the slope (or gradient) of the signal waveform changes, the point where the polarity changes from the positive polarity to the negative polarity with lapse of time will be referred to as the "peak point" in this specification.

The error information storage part 56 stores the interval information obtained from the drop interval information extracting parts 54 and 55, and supplies the interval information to the instruction signal generating part 57. All of the obtained interval information may be supplied to the instruction signal generating part 57 or, only the interval information appearing at a frequency greater than a predetermined threshold value (frequency) may be supplied to the instruction signal generating part 57. The latter case is desirable from the point of view of stabilizing the signal processing.

The instruction signal generating part 57 generates the instruction signals that are supplied to the timing adjusting circuits 412 and 424, based on the interval information obtained from the error information storage part 56. The instruction signals instruct the extent of the delay to be set with respect to one of or both the timing adjusting circuits 412 and 424.

Figure 6A:
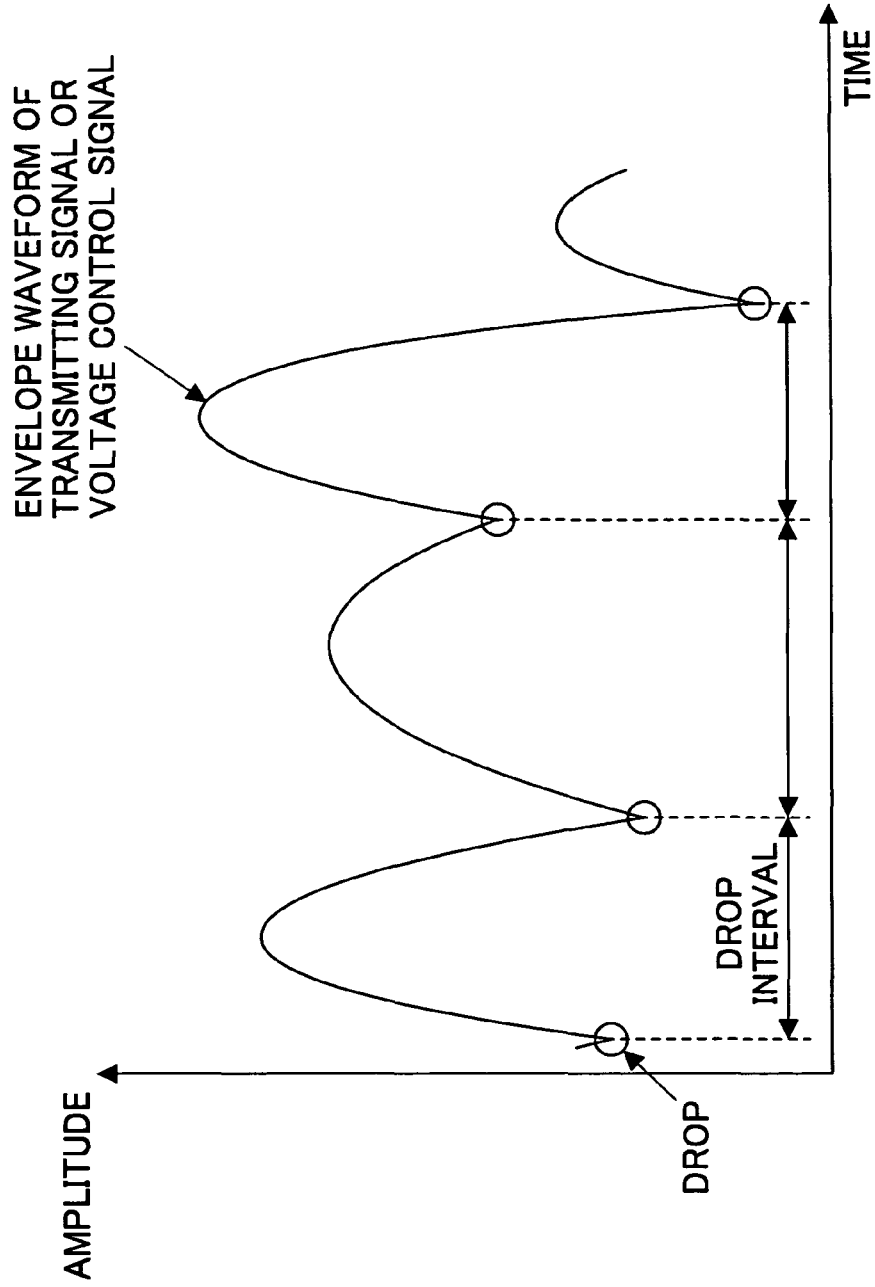
FIG. 6A is a diagram showing a drop and a drop interval of a transmitting signal or a voltage control signal.

FIG. 6A is a diagram showing the drop and the drop interval of the transmitting signal Tx or the voltage control signal v, that is, the envelope waveform of the transmitting signal Tx or the voltage control signal v. FIG. 6A shows four drop points indicated within circular marks, and three drop intervals between adjacent drop points. If the timings of the transmitting signal Tx and the voltage control signal v match, the drop interval related to the transmitting signal Tx becomes the same as the drop interval related to the feedback signal Fb. However, if the timings of the transmitting signal Tx and the feedback signal Fb do not match, the drop interval related to the transmitting signal Tx does not become the same as the drop interval related to the feedback signal Fb.

Figure 6B:
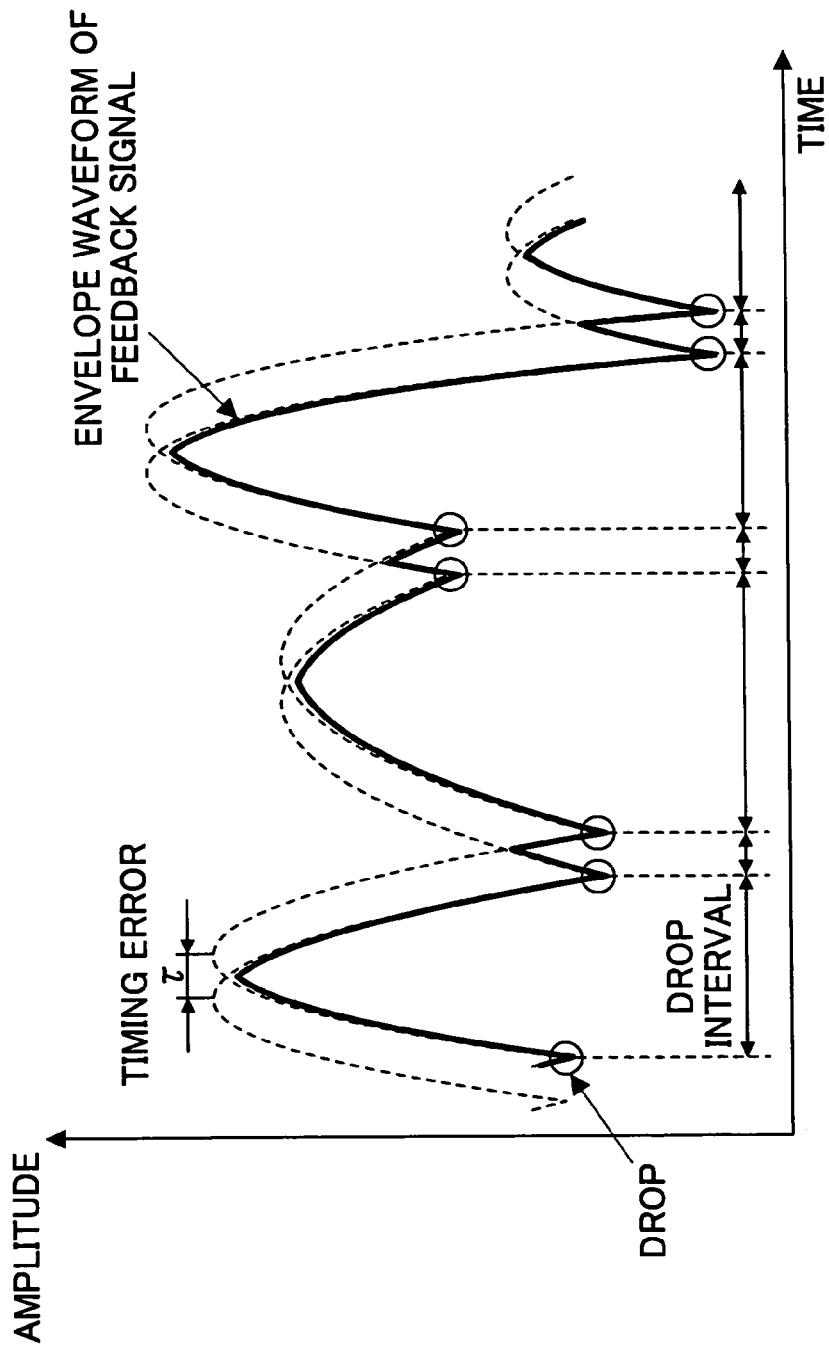
FIG. 6B is a diagram showing a drop and a drop interval of a feedback signal.

FIG. 6B is a diagram showing the drop and the drop interval of the feedback signal Fb, that is, the envelope waveform of the feedback signal Fb. In FIG. 6B, it is assumed for the sake of convenience that a time difference $\tau$ exists between the timings of the transmitting signal Tx and the voltage control signal v. It may be seen from FIG. 6B that seven drop points appear, and that drop intervals of various lengths newly appear. It can be judged that the timings of the transmitting signal Tx and the voltage control signal v do not match based on the fact that the kinds and/or lengths of the drop intervals change. The instruction signal generating part 57 generates the instruction signals that are supplied to the timing adjusting circuit 412 and/or the timing adjusting circuit 424 to set the delay (or phase error) so as to compensate for the timing mismatch. The particular method of calculating the delay (or phase error) will be described later.

Figure 7:
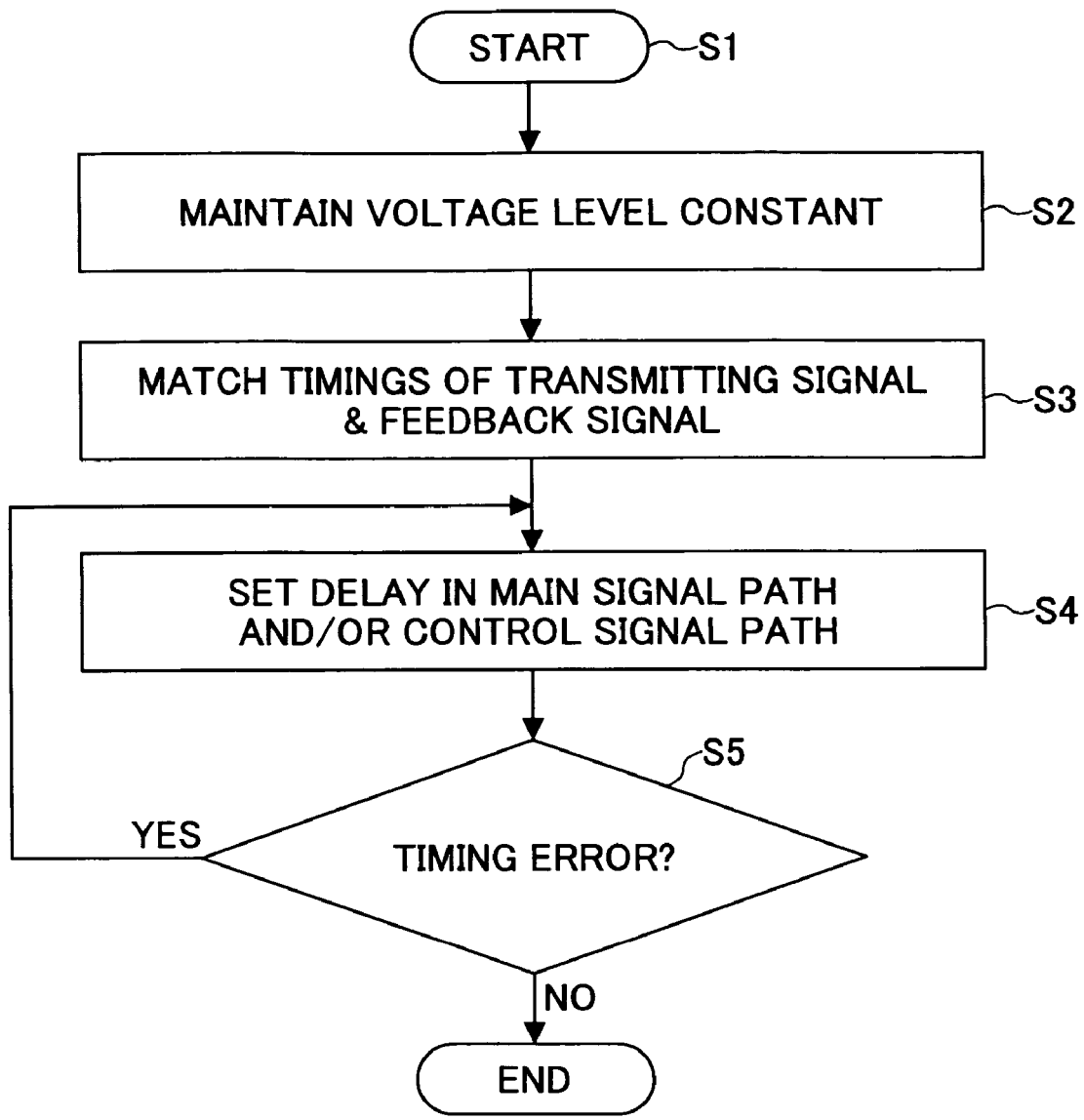
FIG. 7 is a flow chart for explaining the first embodiment of a timing adjusting method according to the present invention.

FIG. 7 is a flow chart for explaining this embodiment of a timing adjusting method according to the present invention. When the process shown in FIG. 7 starts in a step S1, a step S2 maintains the power supply voltage that is supplied to the amplifier 416 shown in FIG. 4 to a constant voltage level Vcc. It is desirable that this constant voltage level Vcc is higher than the amplitude level of any transmitting signal. When this constant voltage level Vcc is supplied to the amplifier 416, the amplifier 416 can linearly amplify the transmitting signal having any amplitude level.

A step S3 supplies a transmitting signal to the amplifier 416, so as to compensate for the phase error between the transmitting signal Tx and the feedback signal Fb. More particularly, the phase error between the transmitting signal Tx and the feedback signal Fb is measured, and the amount of delay (or delay time) of the timing adjusting circuit 412 shown in FIG. 4 or the delay part 51 shown in FIG. 5 is adjusted so as to compensate for the phase error.

A step S4 utilizes at least one of the timing adjusting circuits 412 and 424 to further introduce a delay between the main signal path 41 and the control signal path 42. An initial value of the delay that is introduced may be zero or, a considerably large value.

A step S5 decides whether or not a timing error exists between the transmitting signal Tx and the voltage control signal v, based on the feedback signal Fb. If the decision result in the step S5 is YES, the process returns to the step S4 so as to introduce another delay between the main signal path 41 and the control signal path 42. The procedure described above is repeated thereafter until the timing error becomes sufficiently small. When the timing error becomes sufficiently small and the decision result in the step S5 becomes NO, the process shown in FIG. 7 ends.

The amount of delay introduced between the main signal path 41 and the control signal path 42 in the step S4 may be gradually increased from zero in steps or, gradually decreased from the considerably large value. From the point of view of efficiently compensating for the timing error, it is desirable to change the amount of delay introduced between the main signal path 41 and the control signal path 42 in a manner represented by $0, \pm\alpha, \pm\alpha\pm T, \pm\alpha\pm 2T, \ldots$, where $\alpha$ indicates a minimum value of the drop interval and T denotes a symbol time of the transmitting signal Tx. For example, in the particular case shown in FIG. 6B, the minimum drop interval $\alpha$ is equal to $\tau$ ($\alpha=\tau$). Accordingly, by compensating for the phase error between the transmitting signal Tx and the voltage control signal v by the minimum drop interval $\alpha$, it is possible to match the timings of the transmitting signal Tx and the voltage control signal v.

Figure 8:
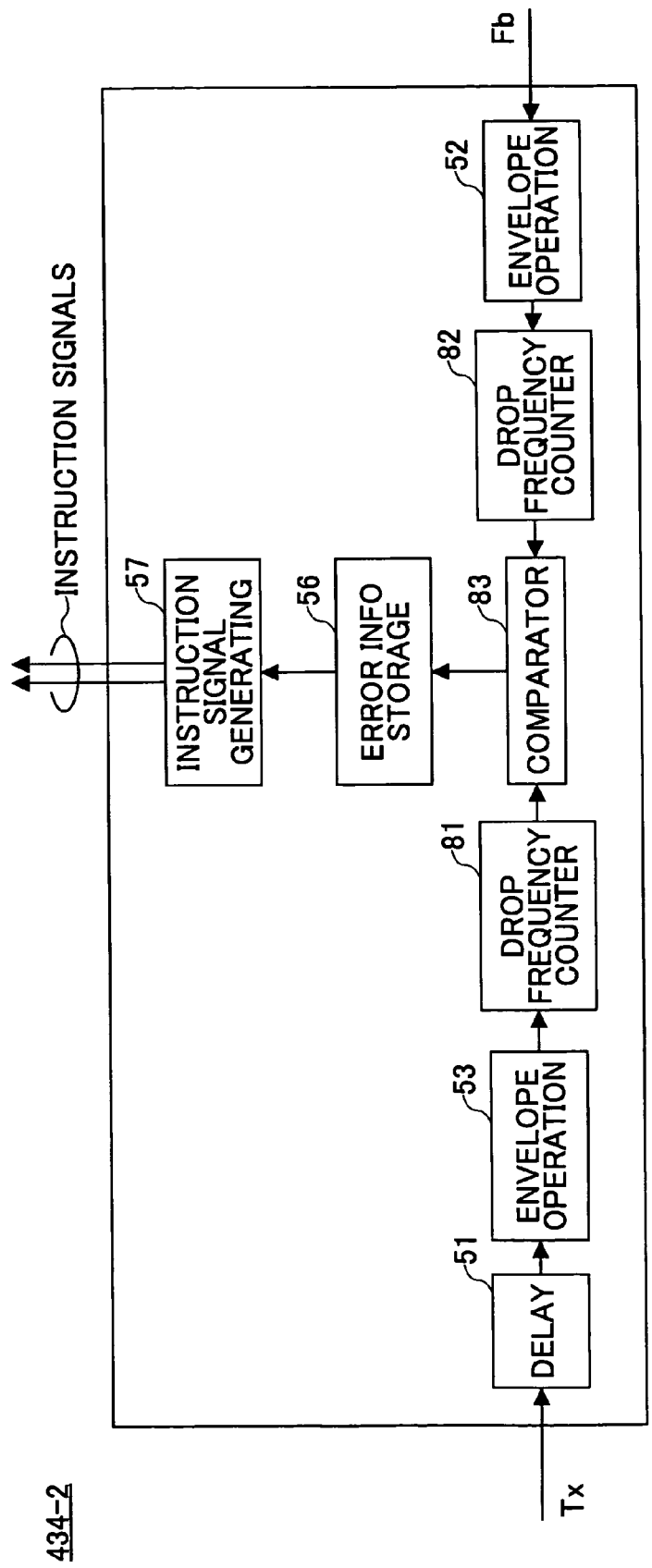
FIG. 8 is a functional block diagram showing a timing error detecting part that is used in a second embodiment of the present invention.

FIG. 8 is a functional block diagram showing a timing error detecting part that is used in a second embodiment of the present invention. In FIG. 8, those parts that are the same as those corresponding parts in FIG. 5 are designated by the same reference numerals, and a description thereof will be omitted. A timing error detecting part 434-2 shown in FIG. 8 may be used as the timing error detecting part 434 shown in FIG. 4. The timing error detecting part 434-2 includes drop frequency counters 81 and 82 and a comparator 83 between the envelope operation parts 52 and 53, with the comparator 83 connected to the error information storage part 56.

The drop frequency counter 81 measures an appearing frequency of drop points of the transmitting signal Tx. The drop frequency counter 82 measures an appearing frequency of drop points of the feedback signal Fb. The comparator 83 compares the appearing frequencies of the drop points of the transmitting signal Tx and the feedback signal Fb, and supplies a comparison result to the error information storage part 56. The error information storage part 56 stores the information related to the appearing frequency of the drop points, and supplies the information related to the drop frequency to the instruction signal generating part 57.

As shown in FIG. 6A, the appearing frequency of the drop points of the transmitting signal Tx is equal to the appearing frequency of the drop points of the feedback signal Fb if the timings of the transmitting signal Tx and the voltage control signal v match. However, if the timings of the transmitting signal Tx and the voltage control signal v do not match, the appearing frequency of the drop points of the transmitting signal Tx and the appearing frequency of the drop points of the feedback signal Fb do not become equal. To be more accurate, the appearing frequency of the drop points of the feedback signal Fb observed becomes larger than the appearing frequency of the drop points of the transmitting signal Tx. Accordingly, it is possible to judge whether or not a timing error exists between the transmitting signal Tx and the voltage control signal v by comparing the appearing frequencies of the drop points of the transmitting signal Tx and the feedback signal Fb. The timing error detecting part 434-2 can detect the timing error based on the operating principle described above.

FIG. 9 is a functional block diagram showing a timing error detecting part that is used in a third embodiment of the present invention. In FIG. 9, those parts that are the same as those corresponding parts in FIG. 5 are designated by the same reference numerals, and a description thereof will be omitted. A timing error detecting part 434-3 shown in FIG. 9 may be used as the timing error detecting part 434 shown in FIG. 4. The timing error detecting part 434-3 includes a slope detector 91, integrators 93 and 94, and a comparator 95.

The slope detector 91 calculates the slope or gradient of the waveform representing the transmitting signal Tx. The slope detector 91 may not only be provided in the timing error detecting part 434-3 of this third embodiment, but may be provided in the timing error detecting part 434-1 of the first embodiment described above or the timing error detecting part 434-2 of the second embodiment described above. The slope or gradient of the waveform may be derived as a differential coefficient of the function representing the waveform. The slope detector 91 prescribes integrating sections of the integrators 93 and 94. In this embodiment, the integrating sections derived from the waveform of the transmitting signal Tx are used in the integrators 93 and 94, but in another embodiment, integrating sections derived from the waveform of the feedback signal Fb may be used in the integrators 93 and 94. In this embodiment, two kinds of integrating sections are prepared, namely, an integrating section in which the slope of the waveform has the positive polarity and an integrating section in which the slope of the waveform has the negative polarity. The integrating section in which the slope of the waveform has the positive polarity is also referred to as a rising section or an increasing section. On the other hand, the integrating section in which the slope of the waveform has the negative polarity is also referred to as a falling section or a decreasing section.

Figure 10A:
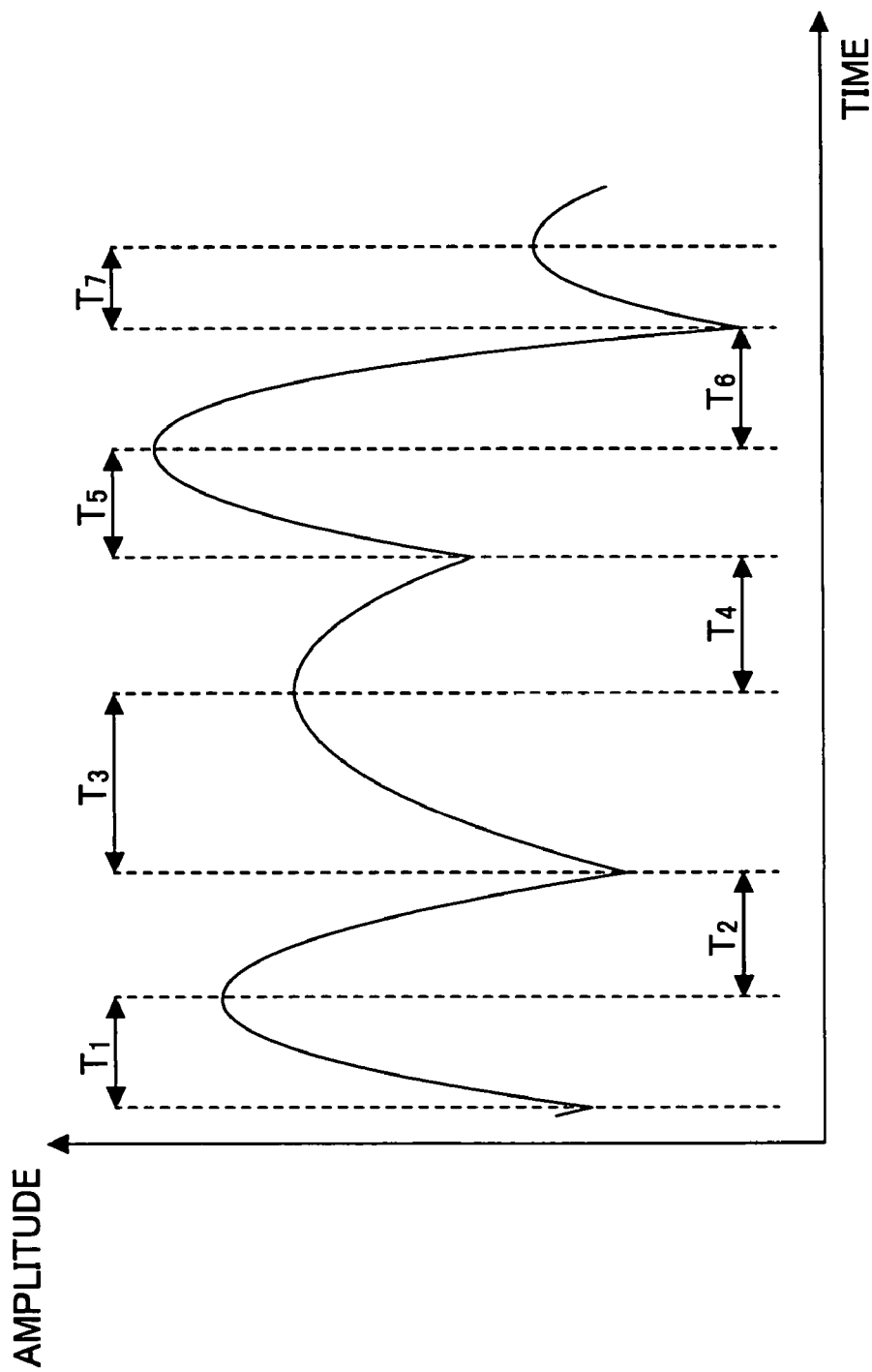
FIG. 10A is a diagram showing a relationship of the transmitting signal and integrating sections.

FIG. 10A is a diagram showing a relationship of the transmitting signal Tx and the integrating sections. In FIG. 10A, the rising sections are prescribed by Todd=T1, T3, T5, and the falling sections are prescribed by Teven=Ts, T4, T6, . . . .

Figure 10B:
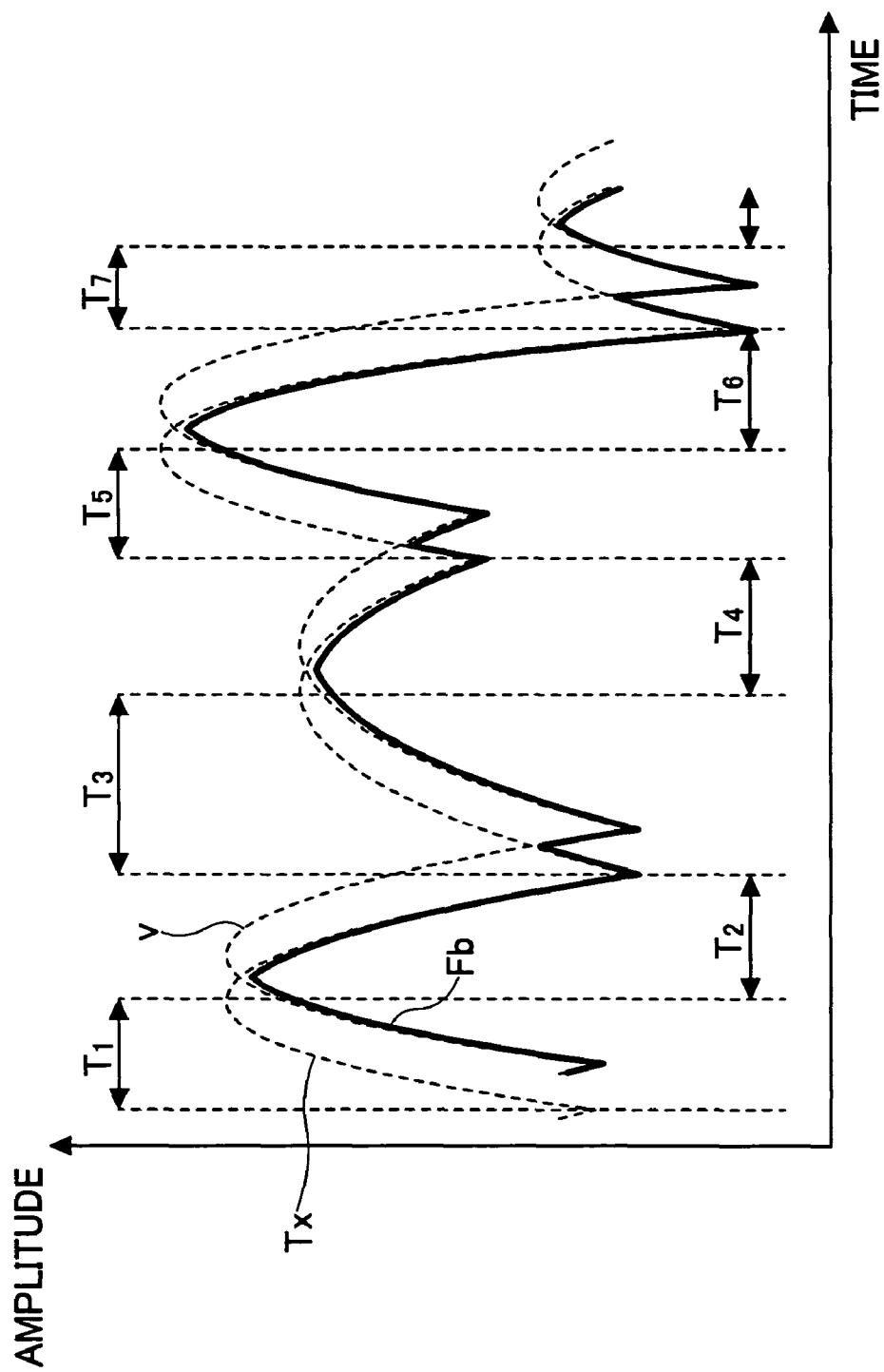
FIG. 10B is a diagram showing a relationship of the transmitting signal, the voltage control signal and the feedback signal, and the integrating sections.

The integrator 93 integrates the transmitting signal Tx in the integrating section prescribed by the slope detector 91, and outputs an integrated signal. The integrator 94 integrates the feedback signal Fb in the integrating section prescribed by the slope detector 91, and outputs an integrated signal. The integrating sections used in the integrators 93 and 94 are Todd or Teven. FIG. 10B is a diagram showing a relationship of the transmitting signal Tx, the voltage control signal v and the feedback signal Fb, and the integrating sections. It should be noted, as may be seen from FIG. 10B, that the feedback signal Fb is integrated in the integrating section Todd or Teven that is derived from the transmitting signal Tx.

The comparator 95 compares integrated values that are obtained from the integrators 93 and 94, and supplies a comparison result to the instruction signal generating part 57.

Figure 11A:
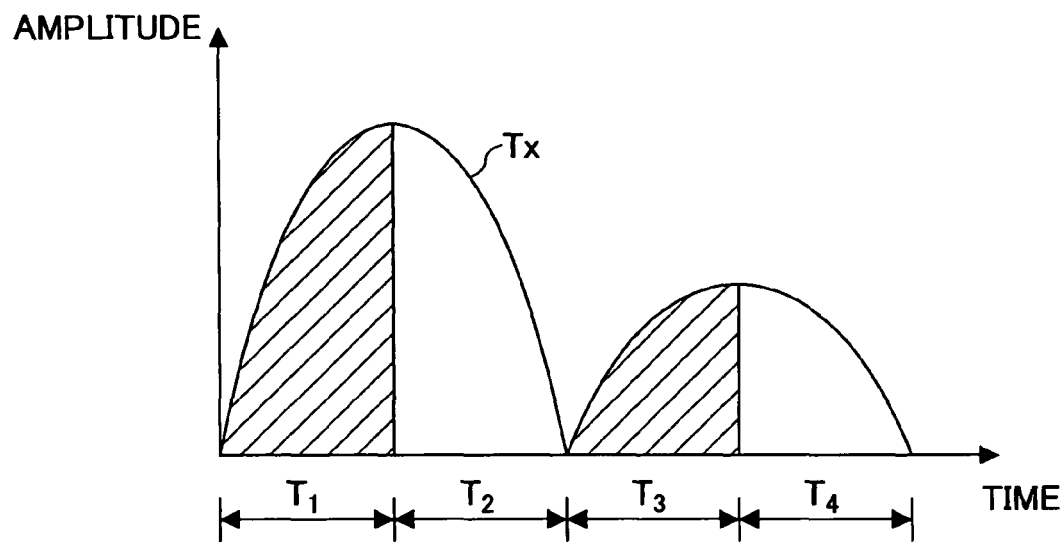
FIG. 11A is a diagram showing a relationship between the transmitting signal and the integrating sections.
Figure 11B:
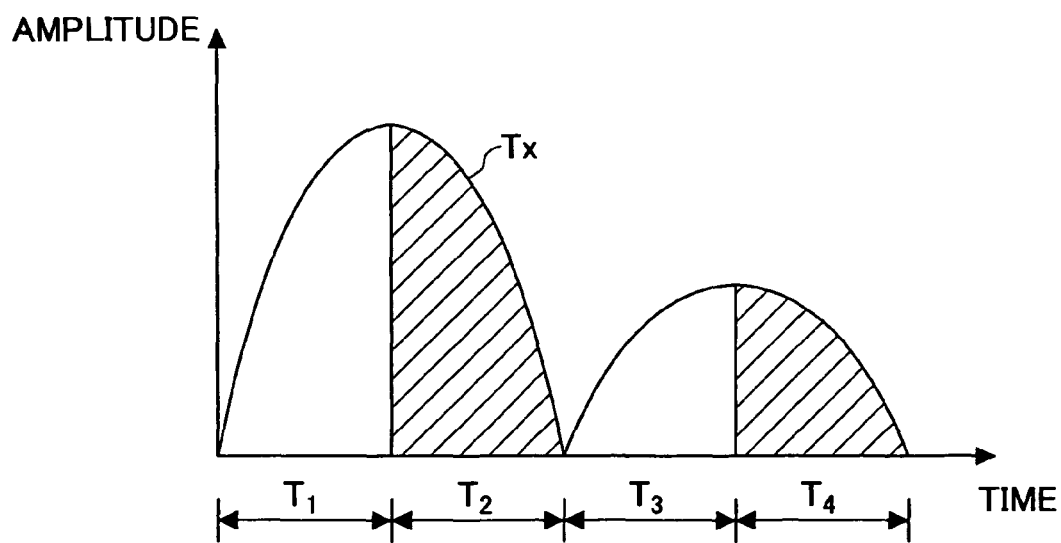
FIG. 11B is a diagram showing a relationship between the transmitting signal and the integrating sections.

FIGS. 11A and 11B respectively are diagrams showing a relationship between the transmitting signal Tx and the integrating sections Todd and Teven. It may be seen from FIGS. 11A and 11B that the increasing section and the decreasing section are alternately arranged every time the polarity of the slope of the waveform of the transmitting signal Tx changes. FIG. 11A shows that a value $Sodd=\int Todd(Tx)dt$ which is obtained by integrating the transmitting signal Tx in the increasing section Todd corresponds to the area of the hatched portion. FIG. 11B shows that a value $Seven=\int Teven(Tx)dt$ which is obtained by integrating the transmitting signal Tx in the decreasing section Teven corresponds to the area of the hatched portion.

Figure 11C:
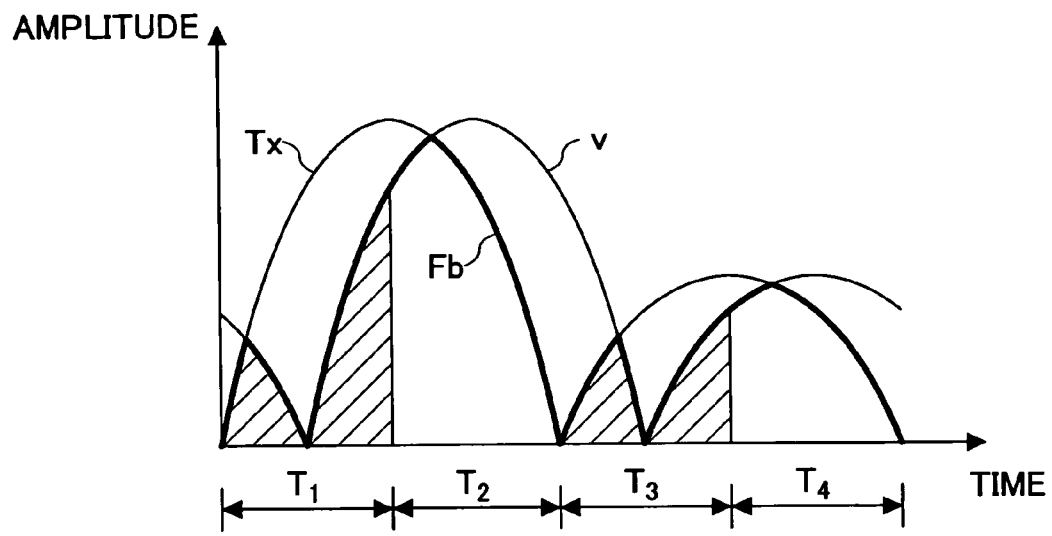
FIG. 11C is a diagram showing a relationship of the transmitting signal, the voltage control signal and the feedback signal, and the integrating sections.
Figure 11D:
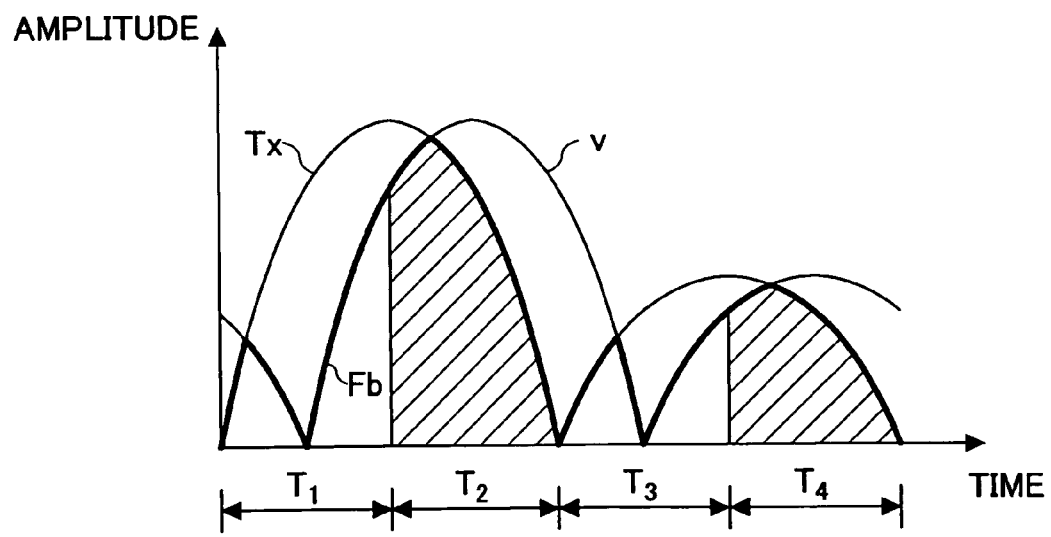
FIG. 11D is a diagram showing a relationship of the transmitting signal, the voltage control signal and the feedback signal, and the integrating sections.

FIGS. 11C and 11D respectively are diagrams showing a relationship of the transmitting signal Tx, the voltage control signal v and the feedback signal Fb, and the integrating section. In FIGS. 11C and 11D, it is assumed for the sake of convenience that there is a slight timing error between the transmitting signal Tx and the voltage control signal v. FIG. 11C shows that a value $Sodd=\int Todd(Fb)dt$ which is obtained by integrating the feedback signal Fb in the increasing section Todd corresponds to the area of the hatched portion. FIG. 11D shows that a value $Seven=\int Teven(Fb)dt$ which is obtained by integrating the feedback signal Fb in the decreasing section Teven corresponds to the area of the hatched portion.

As described above, if the timings of the transmitting signal Tx and the voltage control signal v match, similar values may be expected when the transmitting signal Tx is integrated in the common integrating section Todd or Teven and the feedback signal Fb is integrated in the common integrating section Todd or Teven. In addition, if the integration is made for a long period of time, the value obtained by the integration in the integrating section Todd and the value obtained by the integration in the integrating section Teven may be expected to be similar values. However, if the timing error exists between the transmitting signal Tx and the voltage control signal v, the integrated values become different.

This embodiment uses the integrated value that is obtained by integrating the feedback signal Fb in the integrating section Todd and the integrated value that is obtained by integrating the feedback signal Fb in the integrating section Teven. The two integrated values should become the same if no timing error exists between the transmitting signal Tx and the voltage control signal v. Accordingly, it is possible to detect whether or not the timing error exists between the transmitting signal Tx and the voltage control signal v, by judging whether or not a difference $\Delta Sa=\int Todd(Fb)dt-\int Teven$ (Fb)dt is a sufficiently small value (or by comparing the magnitudes of the two integrated values).

In addition, it is also possible to predict the direction of the timing error by comparing the magnitudes of ∫Todd(Fb)dt and ∫Teven(Fb)dt (or by judging the polarity or sign of the difference ΔSa. When FIGS. 11A through 11D are compared, the area of the hatched portion in FIG. 11C is small compared to the area of the hatched portion in FIG. 11D, and is greatly reduced compared to the area of the hatched portion in FIG. 11A. Further, the area of the hatched portion in FIG. 11D is not greatly reduced compared to the area of the hatched portion in FIG. 11B. The direction of the timing error between the transmitting signal Tx and the voltage control signal v can be predicted from the size relationship of the areas of the hatched portions and the phase relationship of the transmitting signal Tx and the feedback signal Fb.

If only the timing error between the transmitting signal Tx and the voltage control signal v needs to be detected, it is sufficient to judge whether or not a difference ΔSb=∫(All Sections)(Tx)dt−∫(All Sections)(Fb)dt between an integrated value obtained by integrating the transmitting signal Tx in all sections and an integrated value obtained by integrating the feedback signal Fb in all sections is sufficiently small. In this case, it is unnecessary to prepare the integrating sections Todd and Teven, but it becomes necessary to integrate not only the feedback signal Fb but also the transmitting signal Tx.

Next, a description will be given of a fourth embodiment of the present invention. This fourth embodiment calculates a time average of the difference between the transmitting signal Tx and the feedback signal Fb in each of the integrating sections Todd and Teven, so as to judge whether or not the time averages are the same. In other words, the following formulas are calculated.

ΔSc=Sodd−Seven

Sodd=Σ1/(Todd)∫Todd(Tx−Fb)dt

Seven=Σ1/(Teven)∫Teven(Tx−Fb)dt

It is possible to judge whether or not the timing error exists between the transmitting signal Tx and the feedback signal Fb by judging whether or not the difference ΔSc is sufficiently small.

Figure 12A:
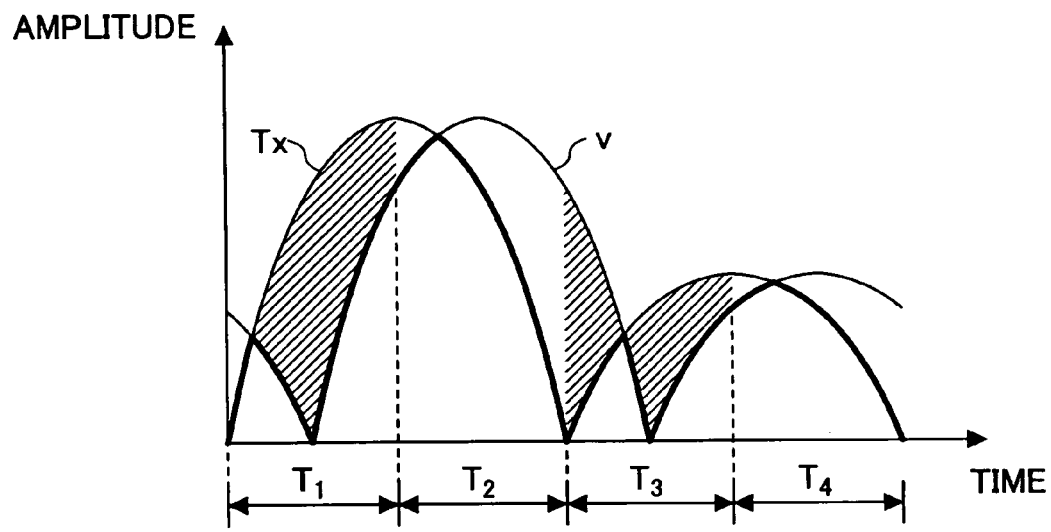
FIG. 12A is a diagram showing regions related to a time average of difference signals.
Figure 12B:
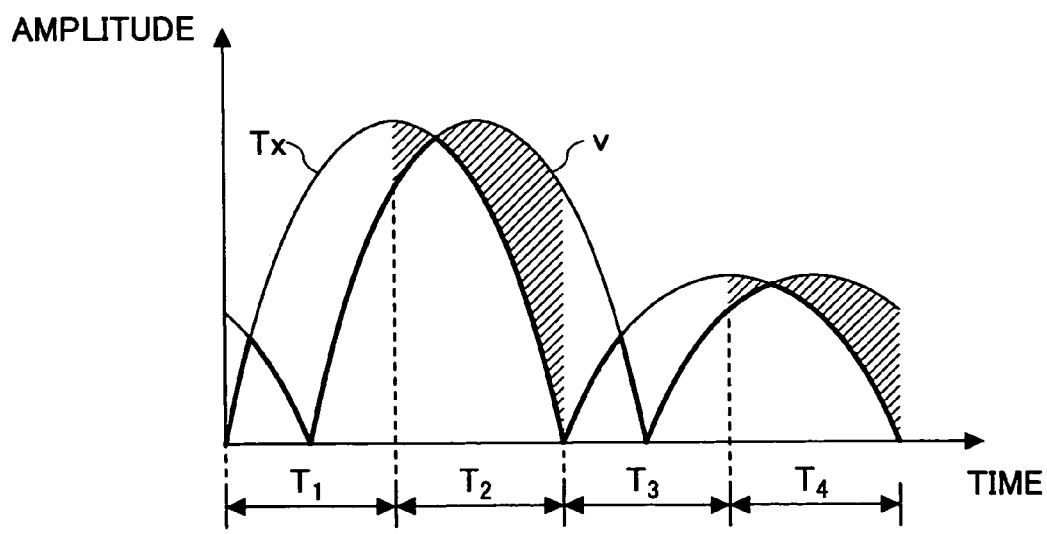
FIG. 12B is a diagram showing regions related to the time average of the difference signals.

FIGS. 12A and 12B respectively are diagrams showing regions related to the time average of difference signals. In the formulas above, a term Sodd=∫Todd(Tx−Fb)dt corresponds to the area of the hatched portion shown in FIG. 12A, and a term Seven=∫Teven(Tx−Fb)dt corresponds to the area of the hatched portion shown in FIG. 12B. Accordingly, the terms Sodd and Seven, that is, the time averages of the difference signals, should be zero if the timings of the transmitting signal Tx and the feedback signal Fb match. This embodiment detects the existence and the direction of the timing error between the transmitting signal Tx and the feedback signal Fb, by judging whether or not one of the terms Sodd and Seven is close to zero and whether or not the difference ΔSc is sufficiently small.

Next, a description will be given of a fifth embodiment of the present invention.

In the first through fourth embodiments described above, the waveform of the voltage control signal v is the same as the waveform of the transmitting signal Tx, although the timings of the voltage control signal v and the transmitting signal Tx may differ. This fifth embodiment uses a voltage control signal v' having a corrected waveform.

Figure 13:
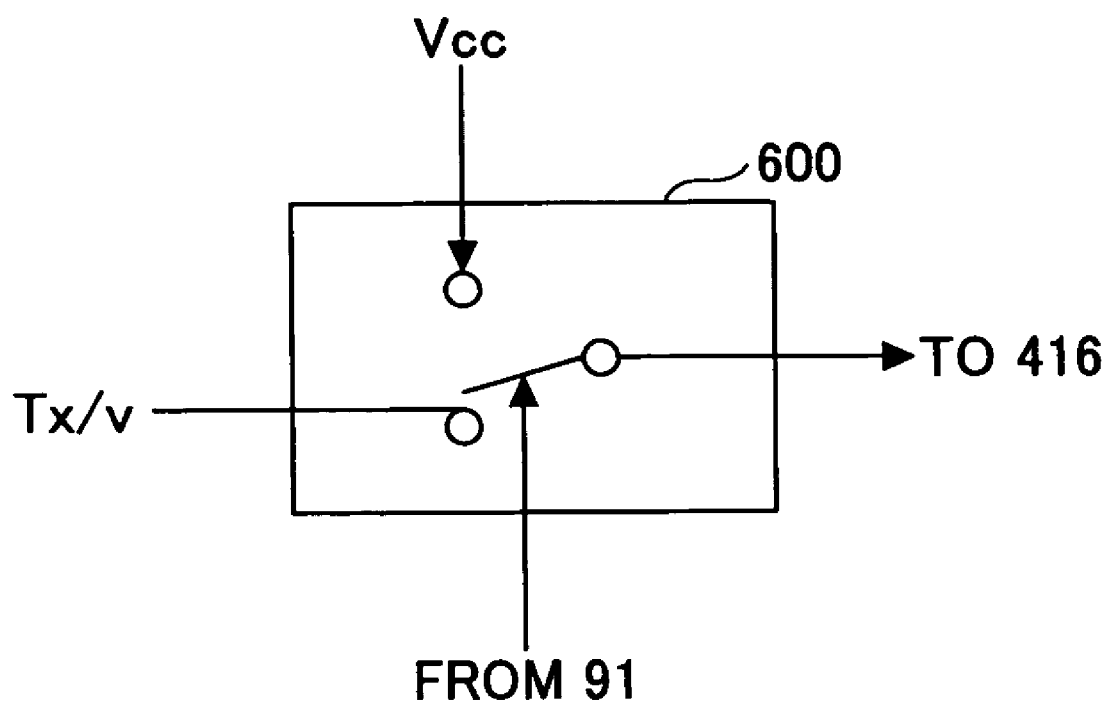
FIG. 13 is a diagram showing a switch.

FIG. 13 is a diagram showing a switch 600. For example, this switch 600 shown in FIG. 13 is provided at an input part of the voltage control signal generating part 422 shown in FIG. 4 or, between the timing adjusting circuit 424 and the amplifier 416 shown in FIG. 4. This switch 600 generates the voltage control signal v' by switching between a signal which has a level that changes and is obtained from the slope detector 91 and the constant power supply voltage level Vcc, every time the polarity transition point of the slope of the transmitting signal Tx occurs. The switch 600 supplies the voltage control signal v' to the amplifier 416.

Figure 14A:
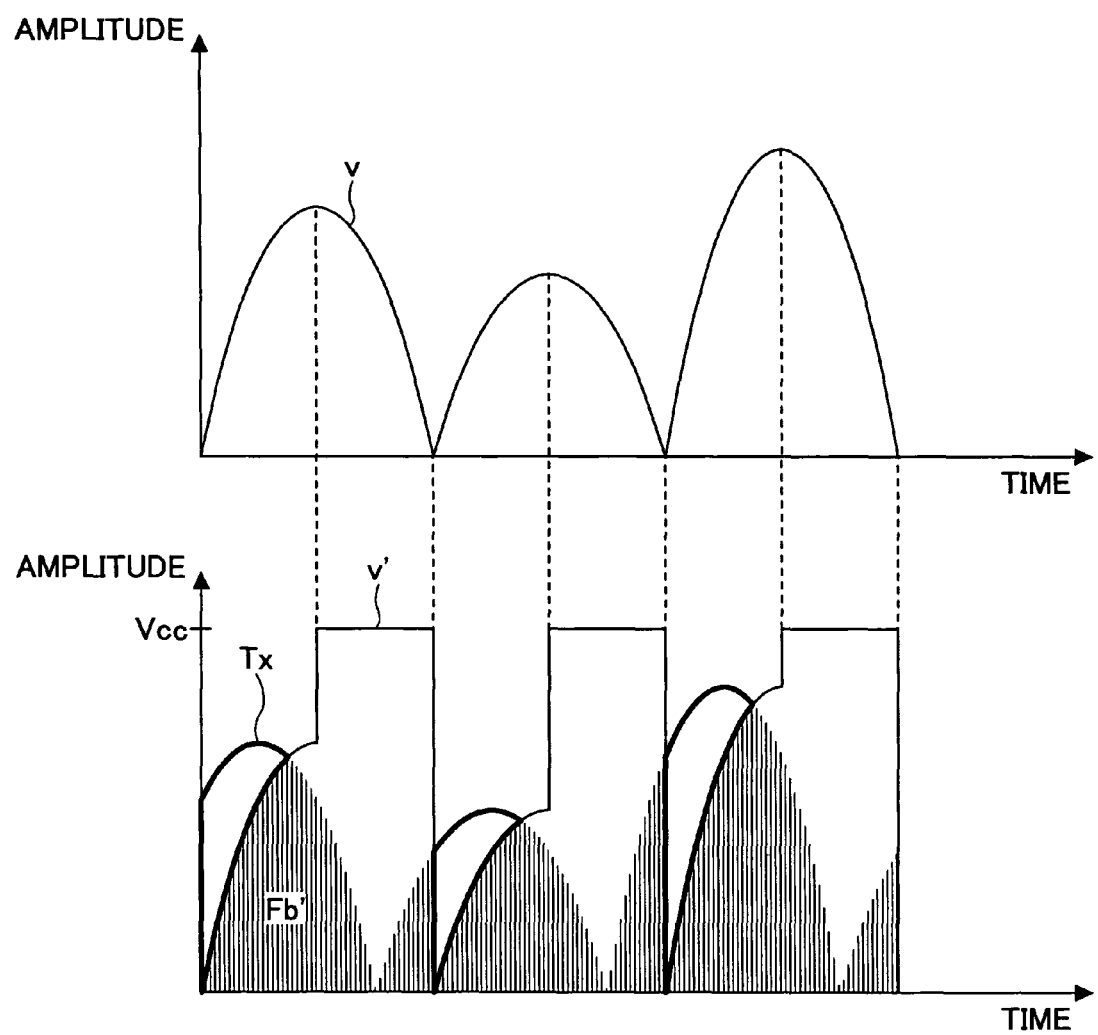
FIG. 14A is a diagram showing the voltage control signal, the transmitting signal and the feedback signal before and after correction.
Figure 14B:
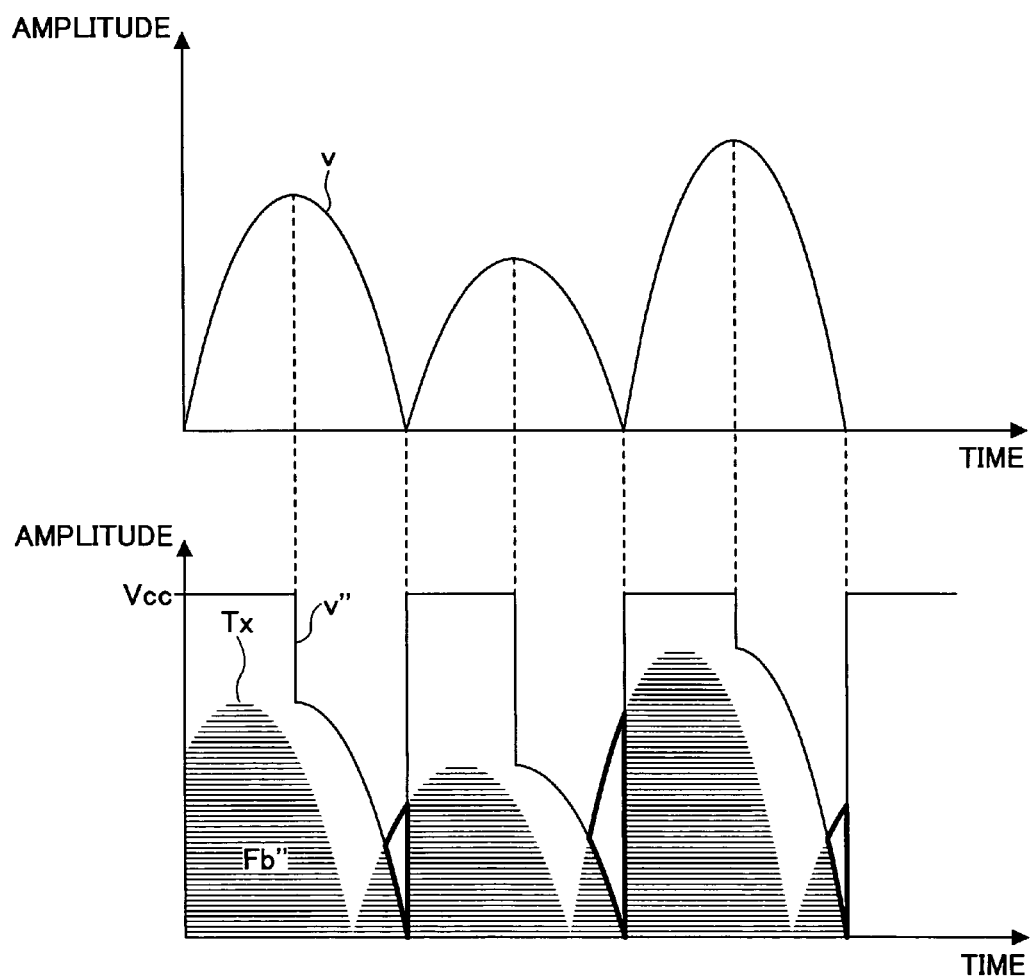
FIG. 14B is a diagram showing the voltage control signal, the transmitting signal and the feedback signal before and after the correction.

FIGS. 14A and 14B respectively are diagrams showing the voltage control signal v, the transmitting signal Tx and the feedback signal Fb before and after the correction.

In FIG. 14A, the upper portion shows the waveform of the voltage control signal v that is derived from the transmitting signal Tx, and the lower portion shows the waveform of the corrected voltage control signal v'. The corrected voltage control signal v' has the waveform of the signal having the level that changes in the increasing section of the transmitting signal Tx and has the constant (fixed) power supply voltage level Vcc in the decreasing section of the transmitting signal Tx. In FIG. 14A, the lower portion also shows the transmitting signal Tx having the timing error. When the transmitting signal Tx is amplified using the corrected voltage control signal v', a feedback signal Fb' having the waveform of the vertical stripe pattern shown in the lower portion of FIG. 14A is obtained.

In FIG. 14B, the upper portion shows the waveform of the voltage control signal v that is derived from the transmitting signal Tx, and the lower portion shows the waveform of a corrected voltage control signal v''. The voltage control signal v shown in the upper portion of FIG. 14B is the same as the voltage control signal v shown in the upper portion of FIG. 14A. The corrected voltage control signal v'' has the waveform of the signal having the level that changes in the decreasing section of the transmitting signal Tx and has the constant (fixed) power supply voltage level Vcc in the increasing section of the transmitting signal Tx. In FIG. 14B, the lower portion also shows the transmitting signal Tx having the timing error. When the transmitting signal Tx is amplified using the corrected voltage control signal v'', a feedback signal Fb'' having the waveform of the horizontal stripe pattern shown in the lower portion of FIG. 14B is obtained.

When the two kinds of feedback signals Fb' and Fb'' are compared, it may be seen that the feedback signal Fb' shown in FIG. 14A deviates relatively greatly from the waveform of the transmitting signal Tx, while the feedback signal Fb'' is relatively close to the waveform of the transmitting signal Tx. In each of FIGS. 14A and 14B, a region surrounded by a bold line represents the error from the waveform of the transmitting signal Tx. Accordingly, when the integrated value for all sections of the feedback signal Fb' and the integrated value for all sections of the feedback signal Fb'' are compared, it may be expected that the latter becomes larger than the former. Based on such a size relationship, it is possible to detect the timing error between the transmitting signal Tx and the voltage control signal v.

More particularly, a first integrated value is calculated by integrating the feedback signal Fb' while supplying the voltage control signal v' shown in FIG. 14A to the amplifier 416. Then, a second integrated value is calculated integrating the feedback signal Fb'' while supplying the voltage control signal v'' shown in FIG. 14B to the amplifier 416. It is possible to judge the existence of the timing error between the transmitting signal Tx and the voltage control signal v by comparing the first integrated value and the second integrated value.

Next, a description will be given of a sixth embodiment of the present invention.

Each of the embodiments described above uses the waveform of the transmitting signal Tx. However, this sixth embodiment uses a test signal having a specific waveform that is known so as to make the timing adjustment.

FIG. 15A is a diagram showing a two-tone signal, and FIG. 15B is a diagram showing a feedback signal that is derived from the two-tone signal shown in FIG. 15A. As shown in FIG. 15B, it is possible to accurately discriminate the peaks of the signal waveform, the drop points of the signal waveform, the drop intervals and the like, when the two-tone signal shown in FIG. 15A is used. Hence, the use of the two-tone signal is desirable from the point of view of improving the measuring accuracy.

As described above, the minimum value of the minimum value $\alpha$ of the drop interval of the waveform of the feedback signal Fb has a constant relationship ($\tau=\pm\alpha, \pm\alpha\pm T, \ldots$) with the timing error $\tau$ between the transmitting signal Tx and the voltage control signal v. Hence, if the period of the two-tone signal is smaller than the timing error (that is, the frequency is too high), it becomes difficult to effectively correct the timing error using the constant relationship. Therefore, as a more practical method, it is desirable to generally calculate the timing error using a low-frequency two-tone signal, and thereafter finely adjust the timing error using a high-frequency two-tone signal. Of course, the test signal is not limited to the two-tone signal, and various other suitable signals may be used instead. For example, a pulse signal may be used as the test signal.

It is possible to arbitrarily combine two or more embodiments described above, so as to suit the needs. In addition, a portion or all of the elements in each of the embodiments described above may be realized by hardware or, by software or, by a combination of hardware and software.

In the case where all of the elements in each of the embodiments described above are realized by software, a computer-readable storage medium according to the present invention may store a program which includes procedures that cause a computer to carry out the steps of the timing adjusting method according to the present invention. The computer-readable storage medium may be formed by any suitable recording media capable of storing the program in a computer-readable manner, such as magnetic recording media, optical recording media, magneto-optical recording media and semiconductor memory devices.

This application claims the benefit of a Japanese Patent Application No. 2006-005110 filed Jan. 12, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A timing adjusting apparatus comprising:
 a timing error detecting part configured to detect a phase error indicative of a timing error between a timing at which an input transmitting signal is received from a main signal path and a timing at which a voltage control signal is received from a control signal path, based on the input transmitting signal that represents an amplitude or a power of a transmitting signal prior to an amplification and a feedback signal that represents an amplitude or a power of the transmitting signal after the amplification, and to generate an instruction signal indicative of the phase error;
 an adjusting part, responsive to the instruction signal, configured to adjust an amount of delay of the main signal path and the control signal path so as to mutually cancel the phase error; and
 a power amplifying part configured to amplify the transmitting signal from the main signal path received via the adjusting part depending on the voltage control signal from the control signal path,
 wherein the timing error detecting part comprises:
  a detector part configured to detect polarity transition points of a slope of a waveform of an envelope component of the input transmitting signal prior to adjustment in the adjusting part and the feedback signal; and
  a phase error measuring part configured to measure the phase error according to values that are acquired from the detected polarity transition points and indicate characteristics of the detected polarity transition points.

2. The timing adjusting apparatus as claimed in claim 1, wherein the phase error measuring part comprises a part configured to measure an interval of the polarity transition points.

3. The timing adjusting apparatus as claimed in claim 1, wherein the phase error measuring part comprises a part configured to measure a number of the polarity transition points.

4. The timing adjusting apparatus as claimed in claim 1, wherein the polarity transition points correspond to points where a decreasing waveform changes to an increasing waveform.

5. The timing adjusting apparatus as claimed in claim 1, wherein polarity transition points appearing at a frequency exceeding a predetermined frequency are selected from the polarity transition points.

6. A timing adjusting apparatus comprising:
 a power amplifying part configured to amplify a transmitting signal from a main signal path depending on a voltage control signal from a control signal path;
 a timing error detecting part configured to detect a phase error between the main signal path and the control signal path based on a to-be-amplified signal that is to be amplified and represents an amplitude or a power of the transmitting signal prior to amplification and a feedback signal that represents an amplitude or a power of the transmitting signal after the amplification; and
 an adjusting part configured to adjust an amount of delay of at least one of the main signal path and the control signal path so as to mutually cancel the phase error,
 wherein the timing error detecting part comprises:
  a detector part configured to detect polarity transition points of a slope of a waveform of the to-be-amplified signal or the feedback signal; and
  a phase error measuring part configured to measure the phase error using the detected polarity transition points,
 and wherein the phase error measuring part comprises:
  a first integrator configured to integrate the to-be-amplified in a section in which the to-be-amplified signal increases; and
  a second integrator configured to integrate the to-be-amplified signal or the feedback signal in a section in which the to-be-amplified signal decreases.

7. The timing adjusting apparatus as claimed in claim 6, wherein the section in which the to-be-amplified signal increases is a section in which the slope of the waveform has a positive polarity.

8. The timing adjusting apparatus as claimed in claim 6, wherein the section in which the to-be-amplified signal decreases is a section in which the slope of the waveform has a negative polarity.

9. The timing adjusting apparatus as claimed in claim 6, wherein:
the first integrator integrates the to-be-amplified signal and the feedback signal in the section in which the to-be-amplified signal increases; and
the second integrator integrates the to-be-amplified signal and the feedback signal in the section in which the to-be-amplified signal decreases.

10. The timing adjusting apparatus as claimed in claim 6, wherein:
the first integrator integrates the feedback signal in the section in which the to-be-amplified signal increases; and
the second integrator integrates the feedback signal in the section in which the to-be-amplified signal decreases.

11. The timing adjusting apparatus as claimed in claim 6, wherein:
the first integrator calculates a time average of differences between the to-be-amplified signal and the feedback signal in the section in which the to-be-amplified signal increases; and
the second integrator calculates the time average of the differences between the to-be-amplified signal and the feedback signal in the section in which the to-be-amplified signal decreases.

12. A timing adjusting apparatus comprising:
a power amplifying part configured to amplify a transmitting signal from a main signal path depending on a voltage control signal from a control signal path;
a timing error detecting part configured to detect a phase error between the main signal path and the control signal path based on a to-be-amplified signal that is to be amplified and represents an amplitude or a power of the transmitting signal prior to amplification and a feedback signal that represents an amplitude or a power of the transmitting signal after the amplification;
an adjusting part configured to adjust an amount of delay of at least one of the main signal path and the control signal path so as to mutually cancel the phase error;
wherein the timing error detecting part comprises:
a detector part configured to detect polarity transition points of a slope of a waveform of the to-be-amplified signal or the feedback signal; and
a phase error measuring part configured to measure the phase error using the detected polarity transition points;
a switch configured to switch between the waveform of the transmitting signal and a waveform of a predetermined level for every polarity transition point, and to output one of the waveforms of the transmitting signal and the predetermined level as the voltage control signal;
a first integrator configured to integrate the feedback signal when the switch outputs the waveform of the transmitting signal as the voltage control signal; and
a second integrator configured to integrate the feedback signal when the switch outputs the waveform of the predetermined level as the voltage control signal.

13. The timing adjusting apparatus as claimed in claim 1, wherein a test signal having a known waveform is used as the transmitting signal.

14. The timing adjusting apparatus as claimed in claim 13, wherein the test signal is formed by a two-tone signal.

15. A timing adjusting method comprising:
detecting a phase error indicative of a timing error between a timing at which an input transmitting signal is received from a main signal path and a timing at which a voltage control signal is received from a control signal path, based on the input transmitting signal that represents an amplitude or a power of a transmitting signal prior to amplification and a feedback signal that represents an amplitude or a power of the transmitting signal after the amplification, and generating an instruction signal indicative of the phase error;
adjusting an amount of delay of the main signal path and the control signal path in response to the instruction signal so as to mutually cancel the phase error; and
amplifying the transmitting signal from the main signal path received via said detecting depending on the voltage control signal from the control signal path,
wherein said detecting includes:
detecting polarity transition points of a slope of a waveform of an envelope component of the input transmitting signal prior to said adjusting and the feedback signal; and
measuring the phase error according to values that are acquired from the detected polarity transition points and indicate characteristics of the detected polarity transition points.

16. A computer-readable storage medium which stores a program for causing a computer to carry out a timing adjustment, said program comprising:
a detecting procedure causing the computer to detect a phase error indicative of a timing error between a timing at which an input transmitting signal is received from a main signal path and a timing at which a voltage control signal is received from a control signal path, based on the input transmitting signal that represents an amplitude or a power of a transmitting signal prior to amplification and a feedback signal that represents an amplitude or a power of the transmitting signal after the amplification, and generating an instruction signal indicative of the phase error;
an adjusting procedure causing the computer to adjust an amount of delay of the main signal path and the control signal path in response to the instruction signal so as to mutually cancel the phase error; and
an amplifying procedure causing the computer to amplify the transmitting signal from the main signal path received via the detecting procedure depending on the voltage control signal from the control signal path,
wherein the detecting procedure includes:
causing the computer to detect polarity transition points of a slope of a waveform of an envelope component of the input transmitting signal prior to the adjusting procedure and the feedback signal; and
causing the computer to measure the phase error according to values that are acquired from the detected polarity transition points and indicate characteristics of the detected polarity transition points.

* * * * *